(12) United States Patent
Bonnell et al.

(10) Patent No.: US 7,586,166 B2
(45) Date of Patent: Sep. 8, 2009

(54) ELECTRONIC AND OPTOELECTRONIC DEVICES HAVING NANOPARTICLES CONFIGURED BY PATTERNED FERROELECTRIC MATERIAL

(75) Inventors: Dawn A. Bonnell, West Chester, PA (US); Xiaojun Joseph Lei, Philadelphia, PA (US); David Conklin, Philadelphia, PA (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 700 days.

(21) Appl. No.: 11/407,008

(22) Filed: Apr. 18, 2006

(65) Prior Publication Data

US 2006/0189004 A1 Aug. 24, 2006

Related U.S. Application Data

(60) Division of application No. 11/128,462, filed on May 12, 2005, now Pat. No. 7,060,510, and a continuation-in-part of application No. 10/344,810, filed as application No. PCT/US01/41726 on Aug. 15, 2001, now Pat. No. 6,982,174.

(60) Provisional application No. 60/667,539, filed on Apr. 1, 2005, provisional application No. 60/225,261, filed on Aug. 15, 2000.

(51) Int. Cl.
*H01L 31/0352* (2006.01)
(52) U.S. Cl. ............... 257/428; 257/431; 257/E31.032
(58) Field of Classification Search ............... 257/428, 257/431; 977/932
See application file for complete search history.

(56) References Cited

U.S. PATENT DOCUMENTS

| | | | | |
|---|---|---|---|---|
| 5,517,280 | A | 5/1996 | Quate | 355/71 |
| 5,606,190 | A | 2/1997 | Hofmann et al. | 257/316 |
| 5,756,263 | A | 5/1998 | Gupta et al. | 430/317 |
| 6,000,947 | A | 12/1999 | Minne et al. | 437/228 |
| 6,262,426 | B1 | 7/2001 | Zafiratos | 250/492.2 |
| 6,597,639 | B1 | 7/2003 | Hamann et al. | 369/13.01 |
| 6,720,553 | B2 | 4/2004 | Bonnell et al. | 250/252.1 |
| 6,787,769 | B2 | 9/2004 | Nakayama et al. | 250/306 |
| 6,873,163 | B2 | 3/2005 | Bonnell et al. | 324/719 |
| 2004/0029297 | A1 | 2/2004 | Bonnell et al. | 438/3 |
| 2005/0052984 | A1 | 3/2005 | Hong et al. | 369/126 |

FOREIGN PATENT DOCUMENTS

WO   WO 02/15240 A1   2/2002

OTHER PUBLICATIONS

Ahn, C.H., et al., "Local, nonvolatile electronic writing of epitaxial Pb(Zr0.52Ti0.48)O3/SrRuO3 heterostructures," *Science*, 1997, 1100-1103.

Allen, T., et al., "Beyond silicon: the future of computing," *Technology Rev.*, May/Jun. 2000, 29 pages.

(Continued)

*Primary Examiner*—Evan Pert
(74) *Attorney, Agent, or Firm*—Woodcock Washburn, LLP

(57) ABSTRACT

Disclosed are electronic, plasmonic and opto-electronic components that are prepared using patterned photodeposited nanoparticles on a substrate surface. Also disclosed are ferroelectric nanolithography methods for preparing components, circuits and devices.

49 Claims, 21 Drawing Sheets

OTHER PUBLICATIONS

Author unknown, "Nano patterning surfaces with electric charge," *Penn Technology News, Univ. of Penn.*, Jun. 2000, 7, entire article.

Bai, F., et al., "Polarization switching in (001)-oriented $Pb(Mg_{frax;1;3}Nb_{frax;2;3})O_3$-X%$PbTiO_3$ crystals: direct observation of heterogeneous nucleation by piezoreponse force microscopy," *Appl. Phys. Letts.*, 2004, 85, 4457-4459.

Bernstein, J., et al., "Micromachined high frequency ferroelectric sonar transducers," *IEEE Trans. Ultrasonics, Ferroelectrics and Frequency Control*, 1997.

Bonnell, D.A., "Scanning tunneling microscopy and spectroscopy of oxide surfaces," *Progress Surface Science*, 1998, 57, 187-252.

Chen, J., et al., "Large on-off ratios and negative differential resistance in a molecular electronic device," *Science*, 1999, 286, 1550-1552.

Dagani, R., "Building from the bottom up," *Chem. & Eng. News*, Oct. 2000, 78, pp. 27, 28, 29 and 32.

Davis, J.R. (Ed.), Davis and Associates, ASM Materials Engineering Dictionary, *ASM International, The Materials Information Society* 1992, pp. 157.

Fowler, T., "It's an extraordinarily small world, after all," *The Phila. Inquirer*, Aug. 24, 2000.

Giocondi, J.L., et al., "Spatially selective photochemical reduction of silver on the surface of ferroelectric barium titanate," *Chem. Mater.*, 2001, 13, 241-242.

Gruverman, A., et al., "Polarization retention in $SrBi_2Ta_2O_9$ thin films investigated at nanoscale," *J. of Applied Physics*, 2001, 89, 1836-1843.

Gruverman, A., et al., "Scanning force microscopy for the study of domain structure in ferroelectric thin films," *J. Vac. Sci. Technol. B*, 1996, 14(2), 602-605.

Hawley, G.G., The Condensed Chemical Dictionary, $8^{th}$ Ed., *Van Nostrand Reinhold Co., NY*, 1971, p. 385.

Henrich, V., et al., The Surface Science of Oxides, *Cambridge University Press*, 1994.

Hotsenpiller, P.A.M., et al., "Orientation dependence of photochemical reactions on $TIO_2$ surfaces," *J. of Phys. Chem.*, 1998, 102, 3216-3226.

*IEEE Standard Dictionary of Electrical and Electronics Terms*, $4^{th}$ Ed., 1999, 364-265.

Kalinin, S.V., et al., "Domain polarity and temperature induced potential inversion on the $BaTiO_3$(100) surface," *J. of Appl. Phys.*, 2002, 91, 3816-3832.

Kalinin, S. V., et al., "Dynamic behavior of domain-related topography and surface potential on the $BaTiO_3$ (100) surface by variable temperature scanning surface potential microscopy," *Z. Metallkund*, 1999, 90, 983.

Kalinin, S. V., et al., "Effect of phase transition on the surface potential of the $BaTiO_3$(100) surface by variable temperature scanning surface potential microscopy," *J of Appl. Phys.*, 2000, 87, 3950-3957.

Kalinin, S. V., et al., "Ferroelectric lithography of multicomponent nanostructures," *Adv. Mater.*, 2004, 16, 795-799.

Kalinin, S. V., et al., "Temperature dependence of polarization and charge dynamics on the $BaTiO_3$(100) surface by scanning probe microscopy," *Appl. Phys. Letts.*, 2001, 78, 1116-1118.

Kramer, N., et al., "Fabrication of metallic nanowires with a scanning tunneling microscope," *Appl. Phys. Lett.*, 1995, 66(11), 1325-1327.

Lin, A., et al., "Epitaxial growth of $Pb(Zr_{0.2}Ti_{0.8})O_3$ on Si and its nanoscale piezoelectric properties," *Appl. Phys. Letts.*, 2001, 78, 2034-2036.

Muralt, P., et al., "Piezoelectric actuation of PZT thin-film diaphragms at static and resonant conditions," *Sensors and Actuators A*, 1996, 53, 398-404.

Page, C.C., et al., "Natural engineering principles of electron tunneling in biological oxidation-reduction," *Nature*, 1999, 402, 47-52.

Pages from IAP/TU Wien STM Gallery and IBM STM Gallery, "The scanning tunneling microscope—What it is and how it works . . . ," website last updated on May 22, 1997, 5 pages.

Pilloud, D. et al., "Surface-promoted thioether linkage between proto- or hemato porphyrins and thiol-silanized quartz: formation of self-assembled monolayers and interaction with imidazole and carbon monoxide," *Langmuir*, 1998, 14, 4809-4818.

Polla, et al., "Ferroelectric thin films microelectromechanical systems applications," *MRS Bulletin*, 1996, 21, 59-65.

Rajeshwar, K., et al., "Cathodic photoprocesses on titania films and in aqueous suspensions," *J. of Electroanalytical Chem.*, 2002, vols. 538-539, 173-182.

Spitler, M.T., et al., "Electron transfer at sensitized $TiO_2$ electrodes," *J. Chem. Phys.*, 1977, 66, 4297-4305.

Tybell, T., et al., "Control and imaging of ferroelectric domains over large areas with nanometer resolution in atomically smooth epitaxial $Pb(Zr_{0.2}Ti_{0.8})O$·Thin films," *Appl. Phys. Letts.*, 1998, 72, 1454-1456.

Tybell, T., et al., "Ferroelectricity in thin perovskite films," *Appl. Phys. Letts.*, 1999, 75, 856-858.

Whatmore, R.W., "Ferroelectrics, Microsystems and nanotechnology," *IEEE Colloquium on Electrotechnical Ceramics—Processing, Properties and Applications*, Nov. 1997, 1 page.

Blanchard, M.P., After diplomas, University City 'is research writ large,' *Phila. Inquirer*, Posted on Sep. 21, 2004, http://64.233.161. 104, 2 pages.

Kalinin, S.V., et al., "Atomic polarization and local reactivity on ferroelectric surfaces: a new route toward complex nanostructures," *Nano Letts.*, 2002, 2(6), 589-593.

Lei, X., et al., "In situ deposition/positioning of magnetic nanoparticles with ferroelectric nanolithography," *J. Mater. Res.*, 2005, 20(3), 712-718.

Lie, X., et al., "In-situ fabrication multi-component nanostructures: ferroelectric nanolithography," *MRS Meeting*, Boston, 2003, 1 page.

Lei, X., et al., Ferroelectric lithography of multicomponent nanostructure, *Ceramic Nanomaterials & Nanotechnology II: Ceramic Transactions*, 2004, 48, 39-51.

Mucha, P., "Tiny, on a grade scale," *Inquirer*, http://www.philly.com, 2005, 3 pages.

2(a)        2(b)        2(c)

2(d)        2(e)        2(f)

3(a)

3(b)

3(c)

3(d)

4(a)

4(b)

4(c)

4(d)

ELECTRONIC AND OPTOELECTRONIC DEVICES HAVING NANOPARTICLES CONFIGURED BY PATTERNED FERROELECTRIC MATERIAL

CROSS REFERENCE TO RELATED APPLICATIONS

This application is a Divisional of Ser. No. 11/128,462 filed May 12, 2005 which claims benefit of U.S. Provisional Application 60/667,539 filed Apr. 1, 2005 and which is a Continuation-In-Part of Ser. No. 10/344,810 filed Sep. 3, 2003 which is a 371 of PCT/US01/41726 filed Aug. 15, 2001 which claims benefit of U.S. Provisional Application 60/225,261 filed Aug. 15, 2000. The entirety of each application is incorporated by reference herein.

STATEMENT OF GOVERNMENT RIGHTS

The invention was made with U.S. Government support. The Government may have certain rights in the invention through the National Science Foundation under federal grant number NSF DMR03-04531.

FIELD OF THE INVENTION

The present invention pertains to electronic and opto-electronic devices and their fabrication. The present invention also pertains to ferroelectric nanolithography methods.

BACKGROUND OF THE INVENTION

It has been widely forecast that fabrication technology for computer chips will reach its limits in about a decade. The dramatic impact that this will have on almost every aspect of technological advance has motivated massive research efforts in industry, academia, and national laboratories to develop the replacement or extension strategy. The objective is to be able to make nanometer sized circuit elements, assemble them into complex circuits, integrate them with current semiconductor device technology, and maintain costs within acceptable limits. To this end, individual nanometer sized elements have been synthesized and shown to be electrically active. These include carbon nanotubes, oxide nanotubes, synthetic proteins and polypeptides, organic molecules, and the like. Present assembly proposals utilize chemical interactions and self-organization of molecules. Likewise, in optical fields the need for miniaturization requires the ability to fabricate optical devices having structures designed and built on the nanometer scale. The advantages afforded by such devices are already established theoretically, and it remains a challenge to create such devices with the beneficial properties predicted. A notable example of a pressing need for these materials is the data storage arena.

Metal nanostructures have been studied extensively in the field of nanoscience. Nanostructures' robust synthetic and functionalization chemistry, in combination with their interesting physical properties, make them ideal structures for fundamental research and applications. In particular, nanostructures made from noble metals, (e.g., Au and Ag) with their associated strong plasmon resonance have generated great interest. The fact that the plasmon response is a sensitive function of nanostructure geometry, coupled with synthetic advances that allow for controlled and systematic variations in nanostructure geometries, is leading to a dramatic increase in interest in this topic. This renaissance is also resulting in a new field called "plasmonics," associated with the design and fabrication of nano-optical components that focus and manipulate light at spatial dimensions far below the classical diffraction limit. New applications of plasmonics, such as metal nanostructure-based strategies for chemical sensing, electromagnetic wave transport, and the development of new optically responsive materials have recently been reported. This is also stimulating an increased theoretical interest in the electronic and electromagnetic properties of nanoscale metal structures.

A formidable technical problem which remains unsolved is to devise a way to successfully position various different elements in a directed manner so as to produce devices, connect them to other components, such as electrodes, and integrate them into conventional as well as news systems (e.g., plasmonic systems). Important advances have been made using new lithographic techniques based on chemically controlled self assembly, microcontact printing, and self assembly in semiconductor film growth. Further advances are needed in preparing nanoscale electronic, opto-electronic and plasmonic devices which have not, heretofore, been made using ferroelectric nanolithography processes.

SUMMARY OF THE INVENTION

In accordance with the present invention, there is provided a method for directing assembly of a nanometer-scale (nanoscale) molecular device. The method is carried out using a substrate of ferroelectric material that has a first polarization distribution, which distribution may have a generally ordered polarization distribution or may have a substantially random polarization distribution. At least one localized region, having a second polarization distribution which is oriented differently relative to the first polarization distribution, is established on the ferroelectric substrate, under the influence of an energy field, such as an electric field, for example, applied to such region. Then, the substrate is exposed to ions of an electrically conductive metal, which ions are deposited selectively at the localized region(s), due to charge interaction between the metal ions and the charge of the localized region(s). The metal ions are converted in the process to elemental metal, to yield a metal-patterned substrate for use in a nanoscale molecular device. Thereafter, at least one functional molecule is chemically bound to the elemental metal and any unbound functional molecule is removed from the substrate, to yield the nanoscale molecular device.

The method of the invention affords a new approach to nano-fabrication of molecular devices, in which molecules capable of functioning as individual device components are controllably assembled to form circuits, optical systems, chemical sensors, and the like. A device so formed includes a substrate of ferroelectric material having at least one localized region at which the polarization is oriented to a predetermined orientation. At least one metal is disposed at the localized region of the device, and at least one functional molecule is bound to the metal.

The nature of the method is such that it retains the advantages of stamping over scanning probe microscope (SPM)-based lithography to provide devices having dimensions on the nanometer scale. The advantages of the method and devices made therefrom will be evident from the following detailed description.

In addition, the present invention provides methods of preparing one or more opto-electronic components by patterning nanoparticles in an arrangement that facilitates a response to optical illumination, comprising applying an electric field in a patterned arrangement to at least a portion of a ferroelectric surface to induce a patterned polarization distribution of the portion of the ferroelectric surface; and photodepositing a plurality of nanoparticles on the portion of the ferroelectric surface having the patterned polarization distribution, at least a portion of the plurality of nanoparticles being positioned adjacent to one or more electrodes. Opto-electronic components and plasmonics components are also provided according to these methods.

The present invention also provides opto-electronic components including a substrate; a ferroelectric surface comprising at least one patterned localized region at which the polarization is oriented to a pre-determined orientation; two or more electrodes situated adjacent to the substrate, the ferroelectric surface, or any combination thereof; and a plurality of nanoparticles situated adjacent to the patterned localized region at which the polarization is oriented to a pre-determined orientation, and the nanoparticles being situated between at least two of the electrodes. Circuits comprising two or more integrated opto-electronic components are also provided herein.

In yet another aspect, the present invention provides methods of preparing a component comprising patterned photodeposited nanoparticles on a substrate surface, the method comprising: scanning an atomic force microscope tip across a first surface of a ferroelectric substrate to alter atomic polarization of specific domains of the surface; controllably biasing the tip using a computer programmable voltage source to produce a desired pattern for the component; contacting the specific domains of the surface to a photosensitive solution; and exposing the photosensitive solution to light to deposit the nanoparticles in the desired pattern. Conductors, resistors, capacitors, waveguides, inductors, oscillators, transistors, and the like, are provided as set forth herein.

BRIEF DESCRIPTION OF THE DRAWINGS

The foregoing summary and the following detailed description of the preferred embodiments of the present invention will be best understood when read in conjunction with the appended drawings.

Figure 5:
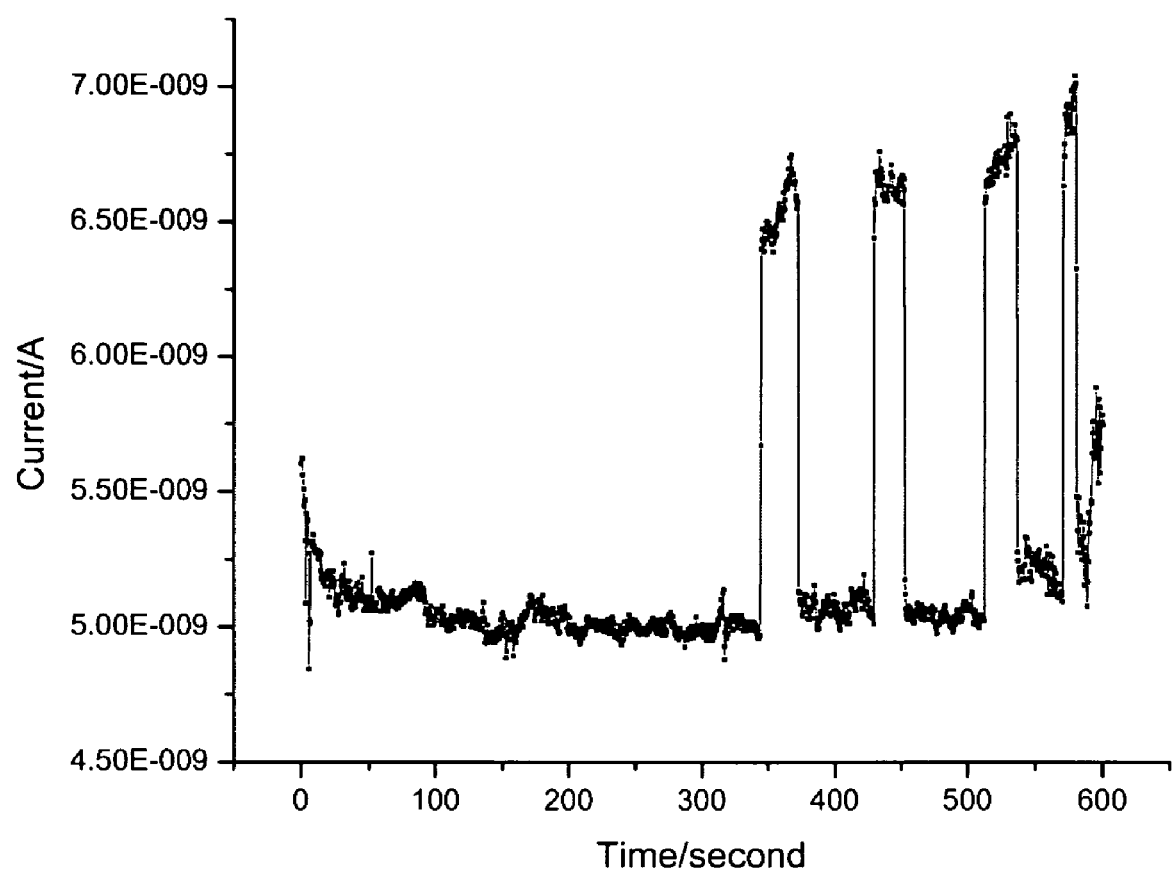
Figure 6A:
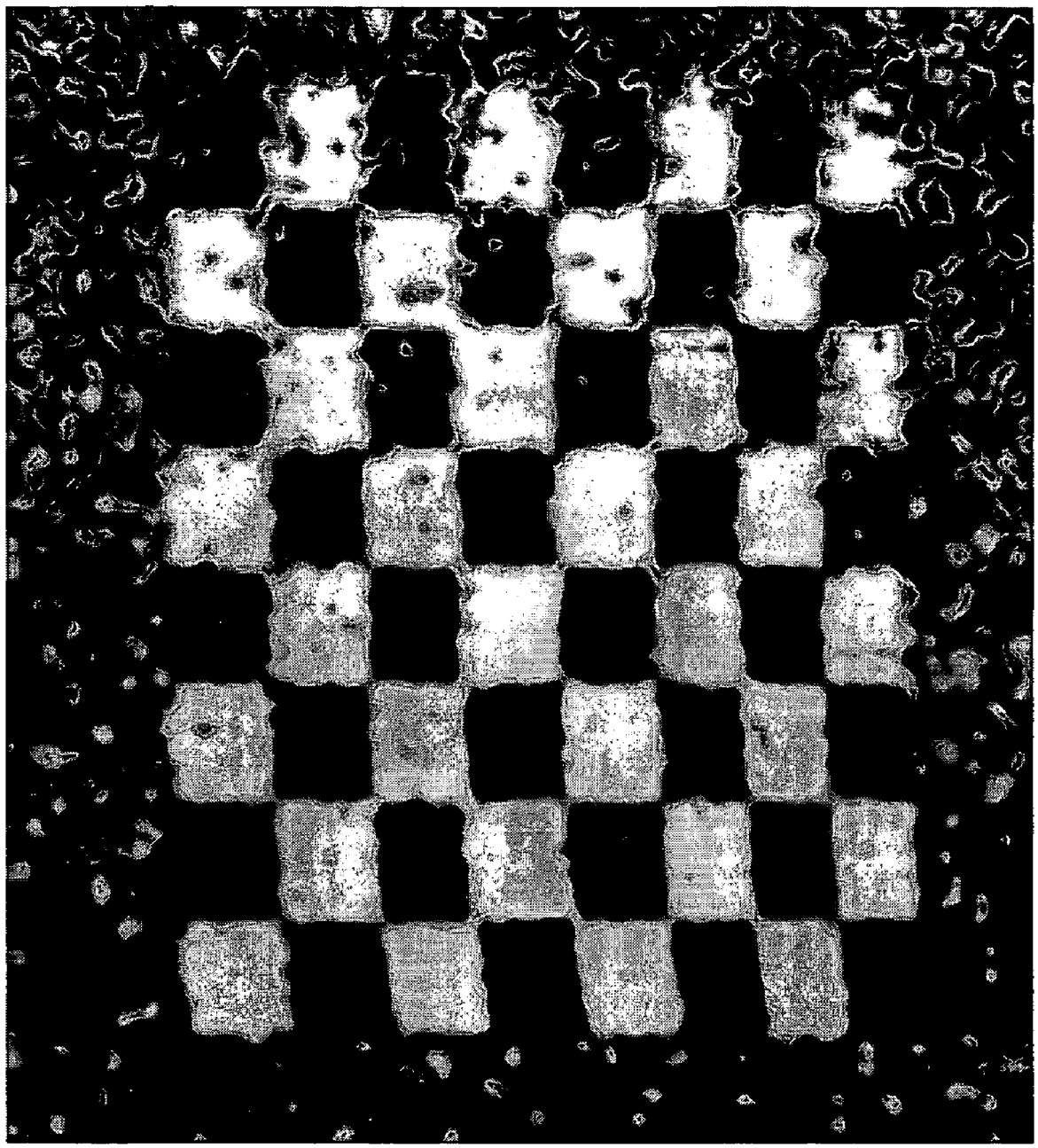
Figure 6B:
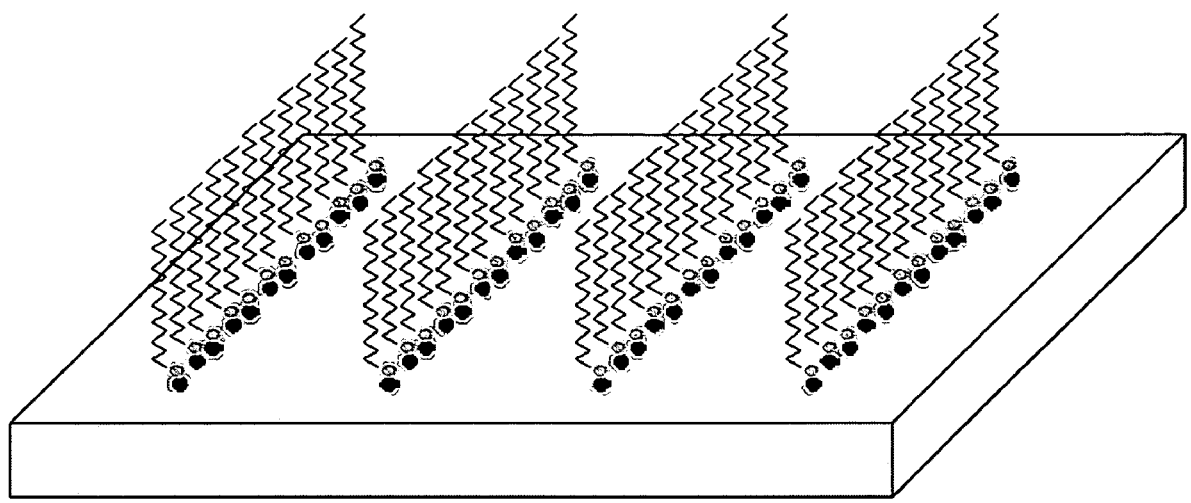
Figure 6C:
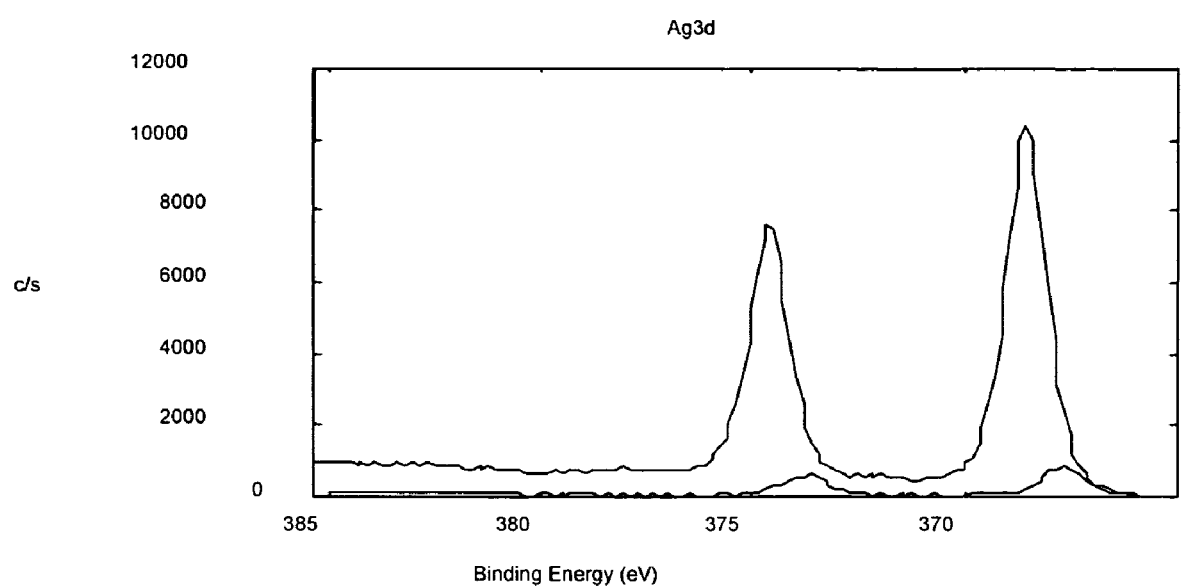
Figure 6D:
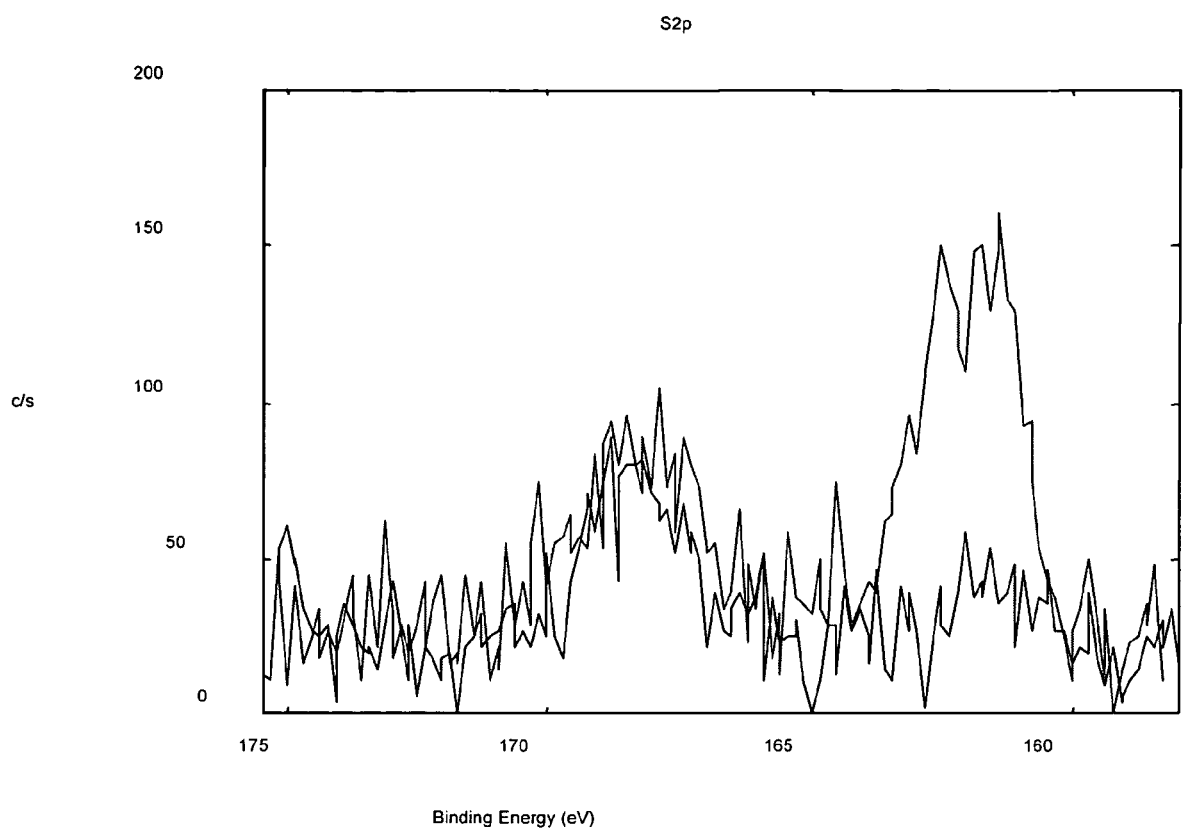

The photomicrographs of FIGS. 2(a) and 2(d) show the surface topography and polarization distribution, respectively, of a substrate prior to −10 V switching;

The photomicrographs of FIGS. 2(b) and 2(e) show the surface topography and polarization distribution, respectively, of the substrate of FIG. 2(a) after −10 V switching;

The photomicrographs of FIGS. 2(c) and 2(f) show the surface topography and polarization distribution, respectively, of a substrate after −10 V switching;

FIGS. 3(a)-3(d) are photomicrographs showing the surface topography, polarization distribution, and deposition pattern for silver and palladium on a BaTiO$_3$ substrate surface;

The photomicrograph of FIG. 3(a) shows the surface topography of the substrate prior to metal deposition;

The photomicrograph of FIG. 3(b) shows the polarization distribution of the substrate prior to metal deposition;

The photomicrograph of FIG. 3(c) shows the surface topography of the substrate after silver deposition on the surface;

The photomicrograph of FIG. 3(d) shows the surface topography of the substrate after palladium deposition on the surface;

FIGS. 4(a)-4(d) are photomicrographs showing a BaTiO$_3$ substrate surface before and after silver deposition;

The photomicrographs of FIGS. 4(a) and (b) show the surface topography of the substrate before and after silver deposition, respectively;

The photomicrographs of FIGS. 4(c) and 4(d) show the substrate surface polarization distribution before and after switching, respectively;

FIG. 5 provides results of current versus time for an embodiment of an opto-electronic component of the present invention made using the Ag—PP nanoparticles described Table I. The device was subjected to a temporally varying illumination (light off/light on).

FIGS. 6(a-d) provides XPS data results of the surface of an embodiment of an opto-electronic device of the present invention made using the Ag-16cSH nanoparticles described in Table I. The XPS results confirm that organic molecules attach preferentially to the metal particles.

Figure 7:
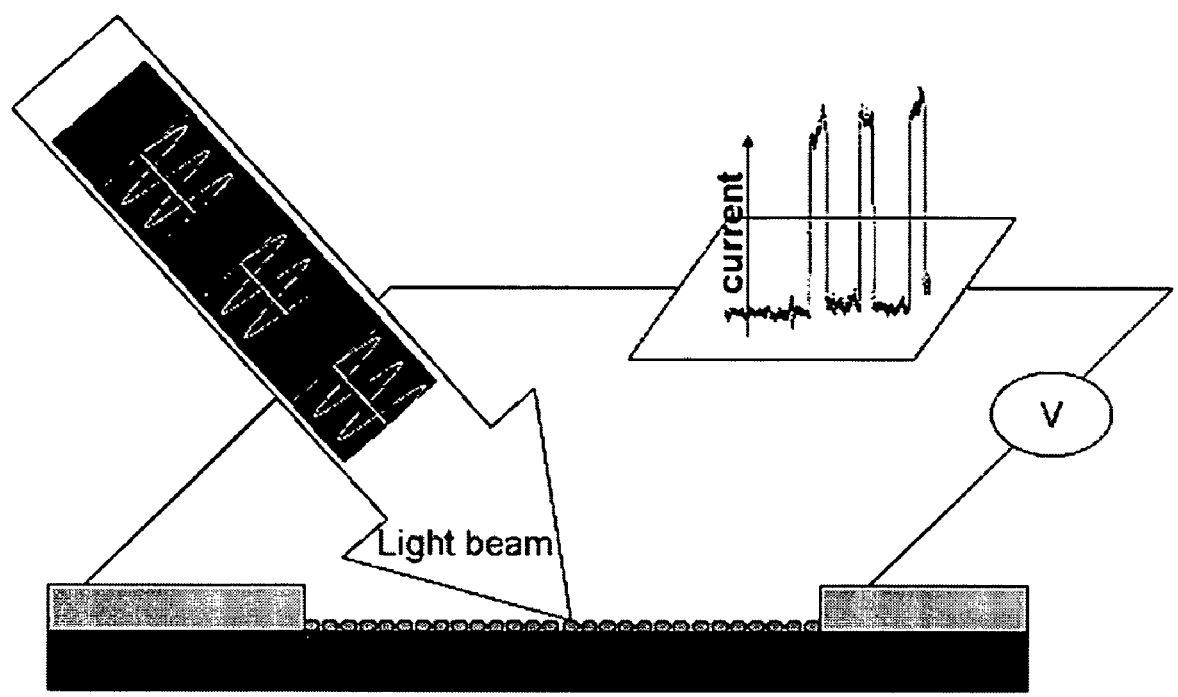

FIG. 7 illustrates an embodiment of an opto-electronic circuit of the present invention having a linear array of a plurality nanoparticles situated in a linear array between two electrodes. The optical switch is based on a linear array of nanoparticles photoconductance. The opto-electronic component serves as an optical switch. Under a bias, the current going through the device increases to a higher level with a light beam illuminating the nanoparticles, and returns to a low level with the illumination off.

Figure 8:
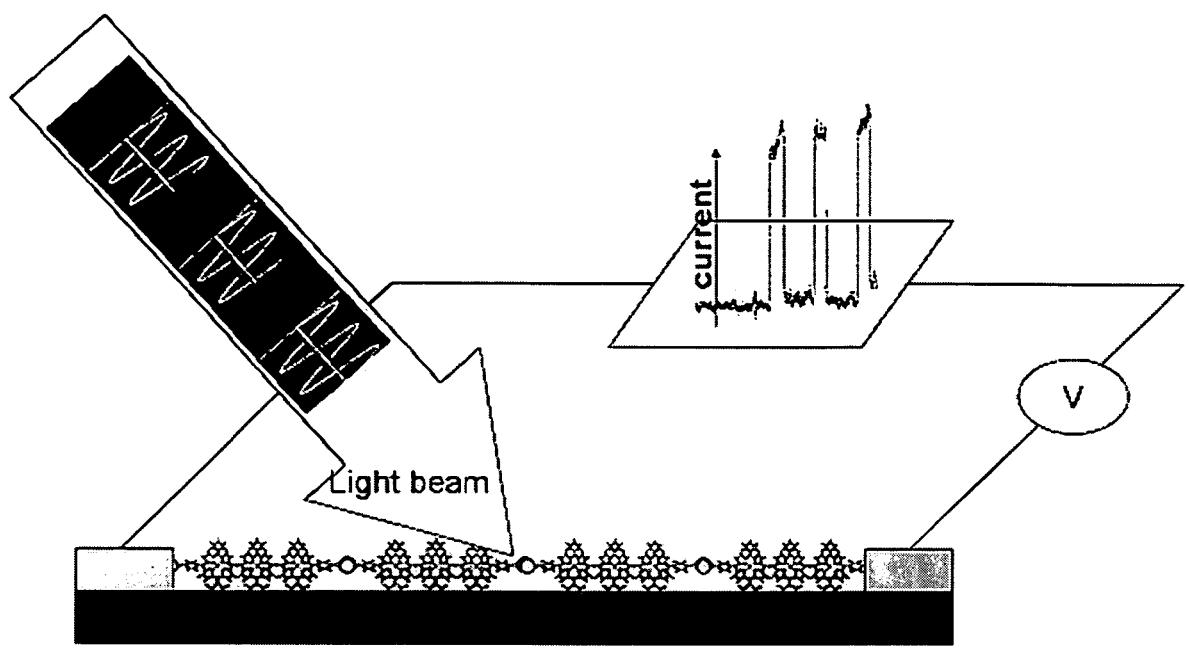

FIG. 8 illustrates an embodiment of an opto-electronic circuit of the present invention having a linear array of a plurality nanoparticles bridged between bridging molecules situated in a linear array between two electrodes. The opto-electronic component serves as an optical switch. Under a bias, the current going through the device increases to a higher level with a light beam illuminating the nanoparticles, and returns to a low level with the illumination off.

Figure 9:
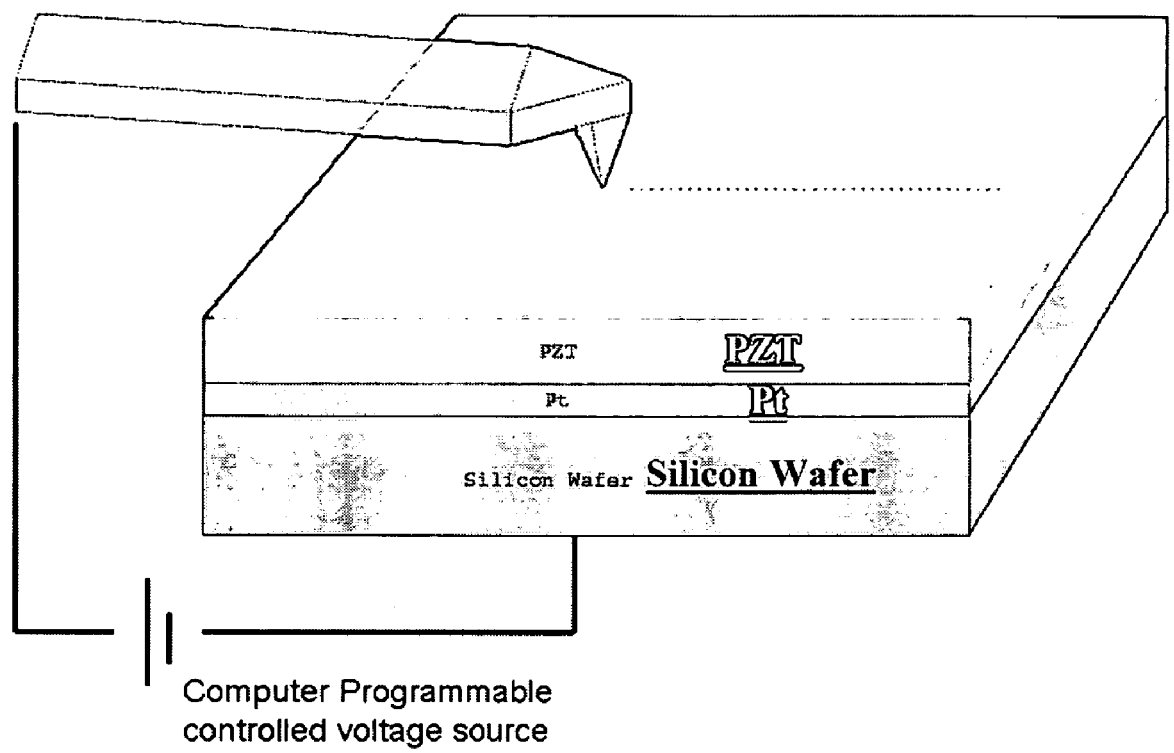

FIG. 9 is a schematic illustration of an embodiment of the present invention showing how atomic polarization can be oriented with a conductive SPM tip and applied voltages.

Figure 10A:
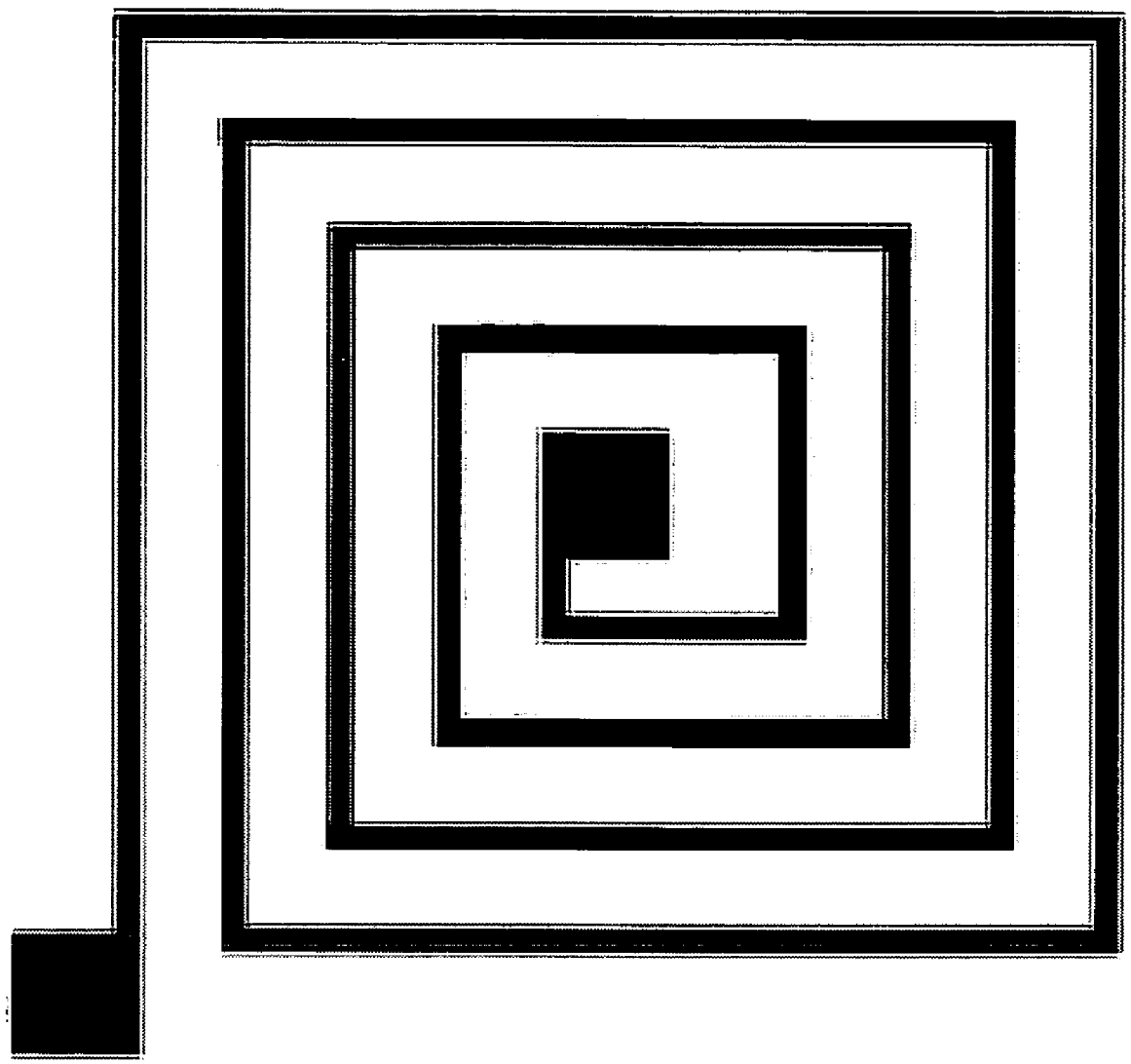

FIG. 10(a) illustrates a computer generated pattern design of an inductor.

Figure 10B:
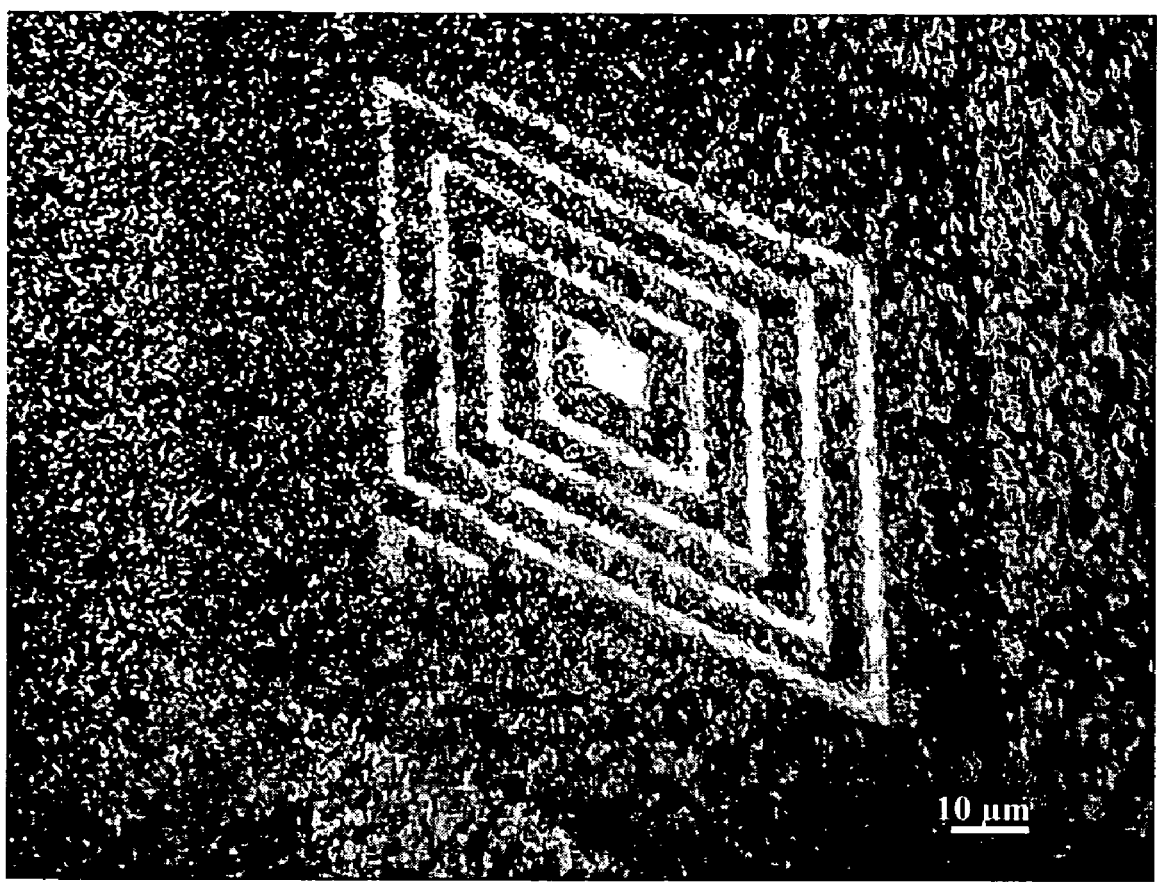

FIG. 10(b) is an optical image of an inductor device made according to the present invention.

Figure 11A:
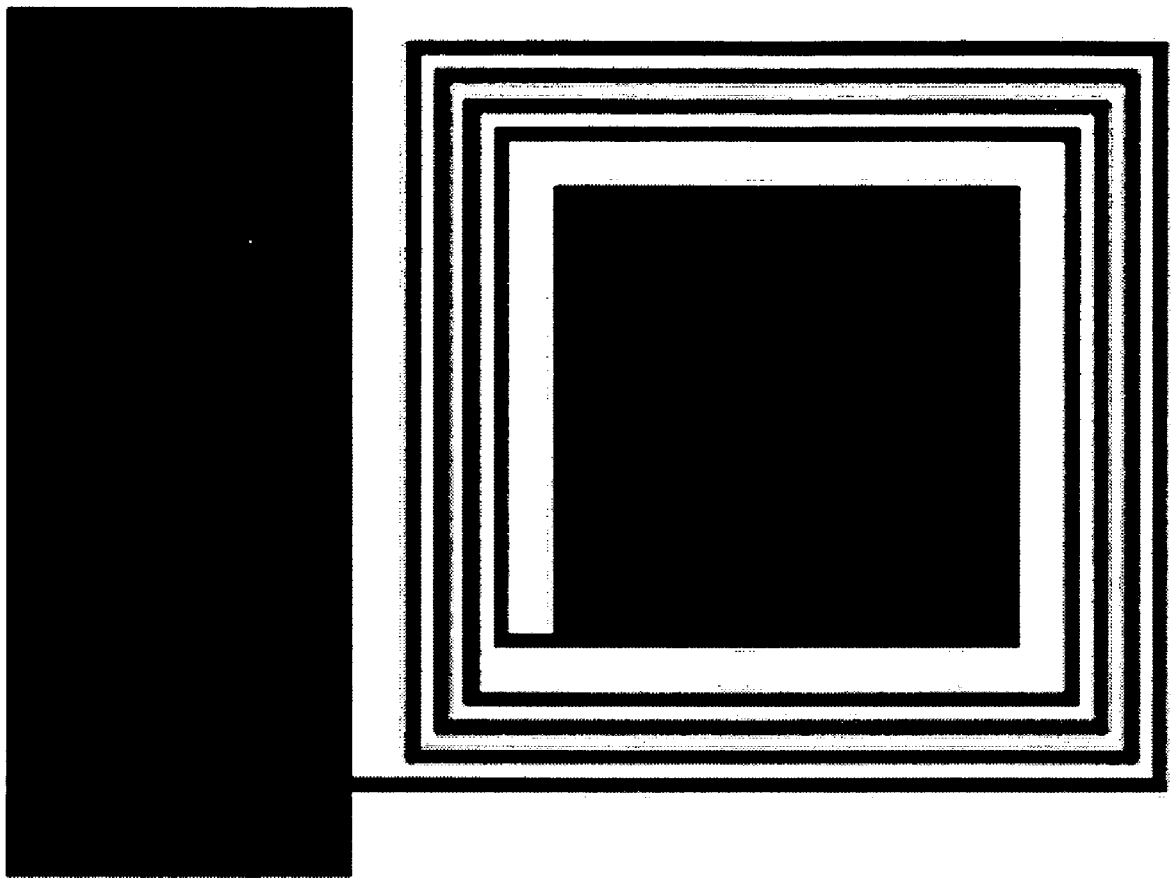
Figure 11B:
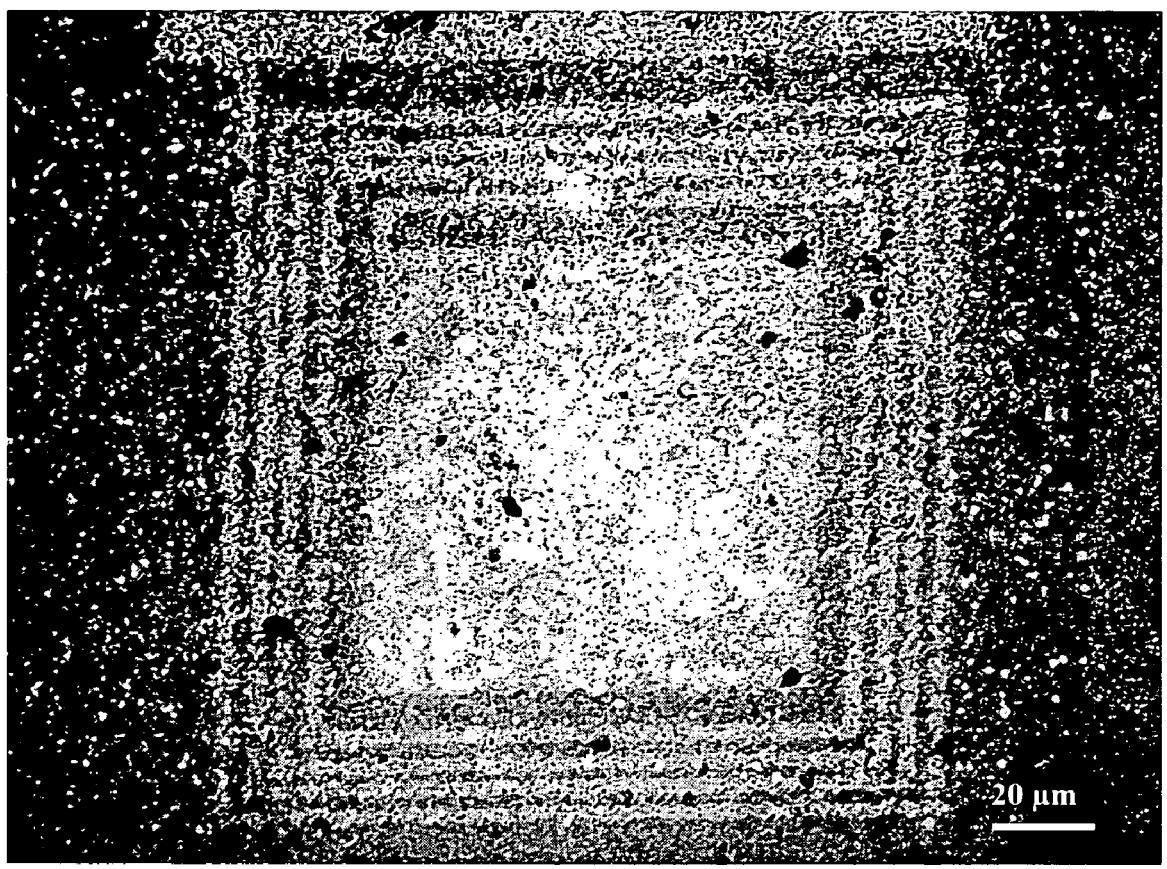
Figure 11C:
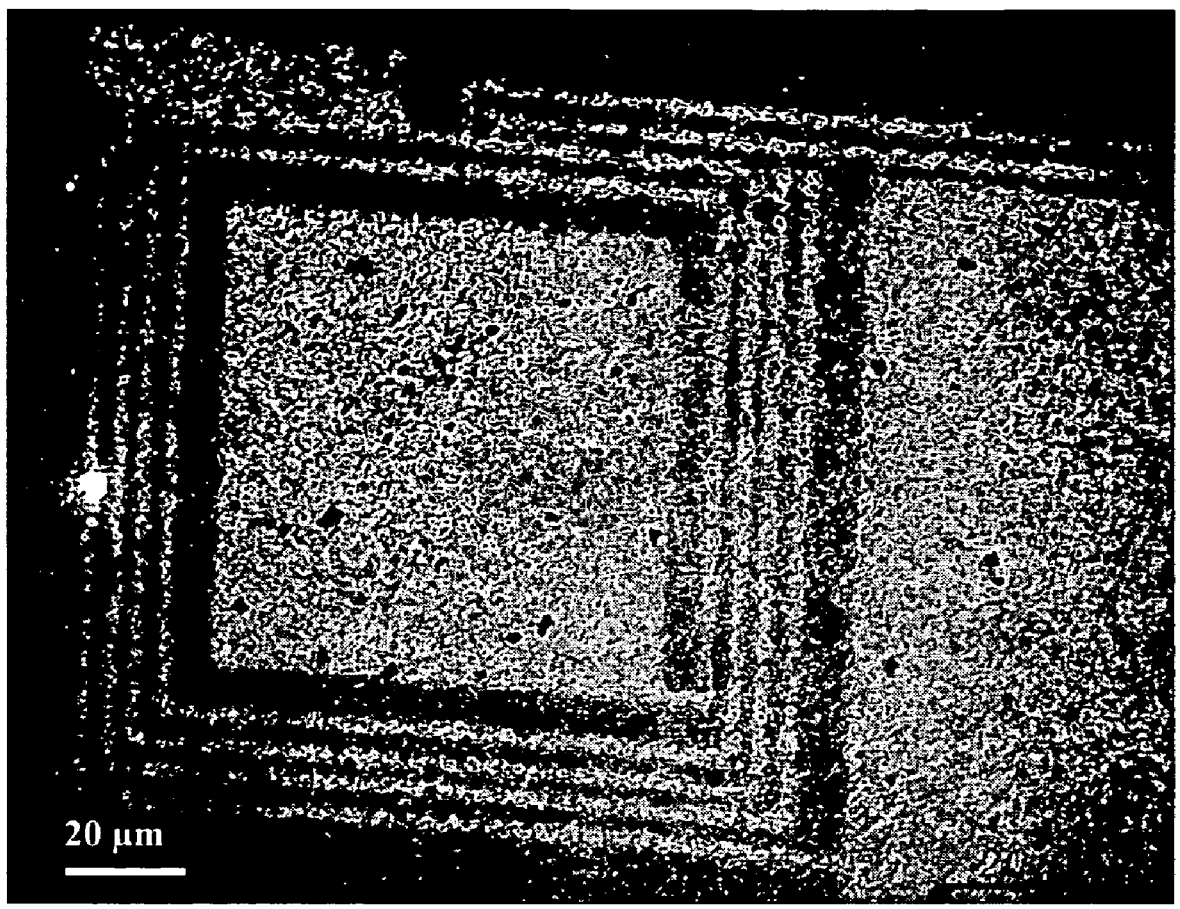
Figure 11D:
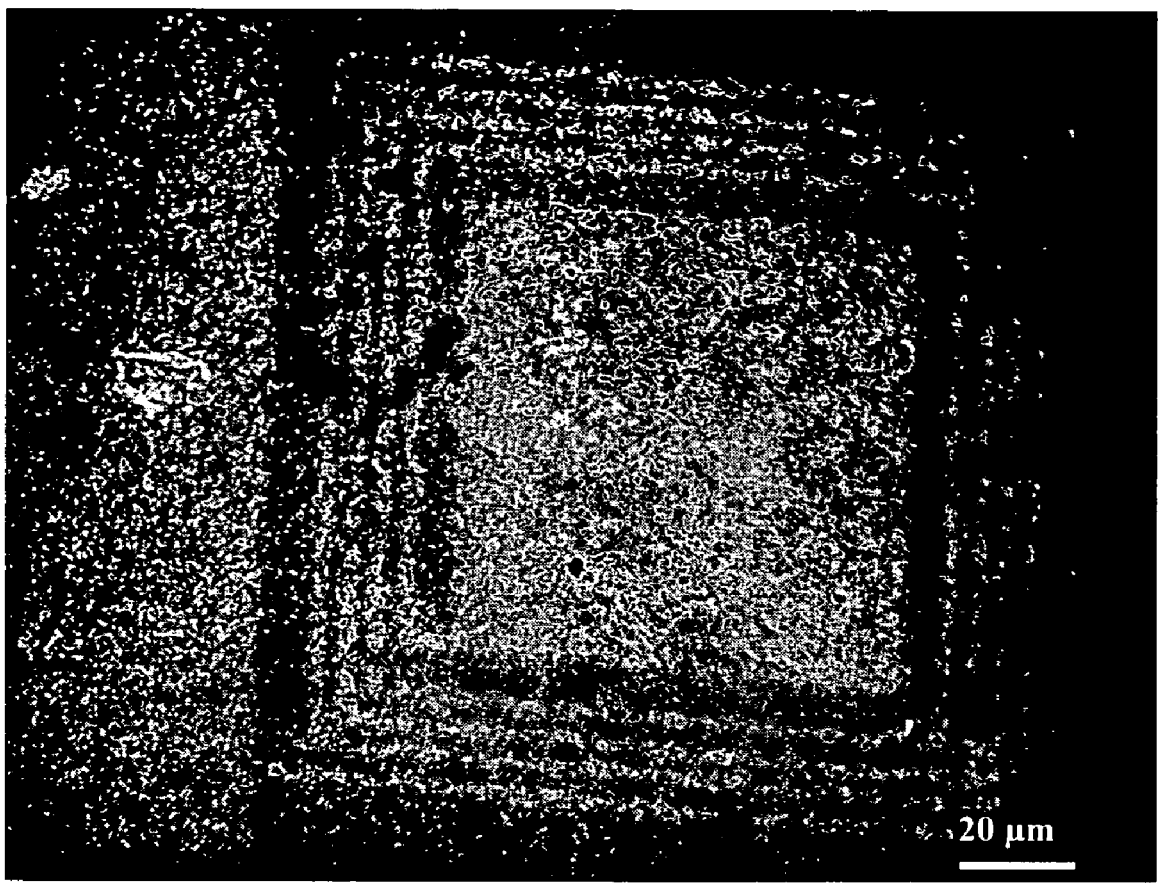

FIG. 11(a) illustrates a computer generated pattern design of an inductor.

FIGS. 11(b, c, d) are optical images of inductors made according to the present invention.

Figure 12A:
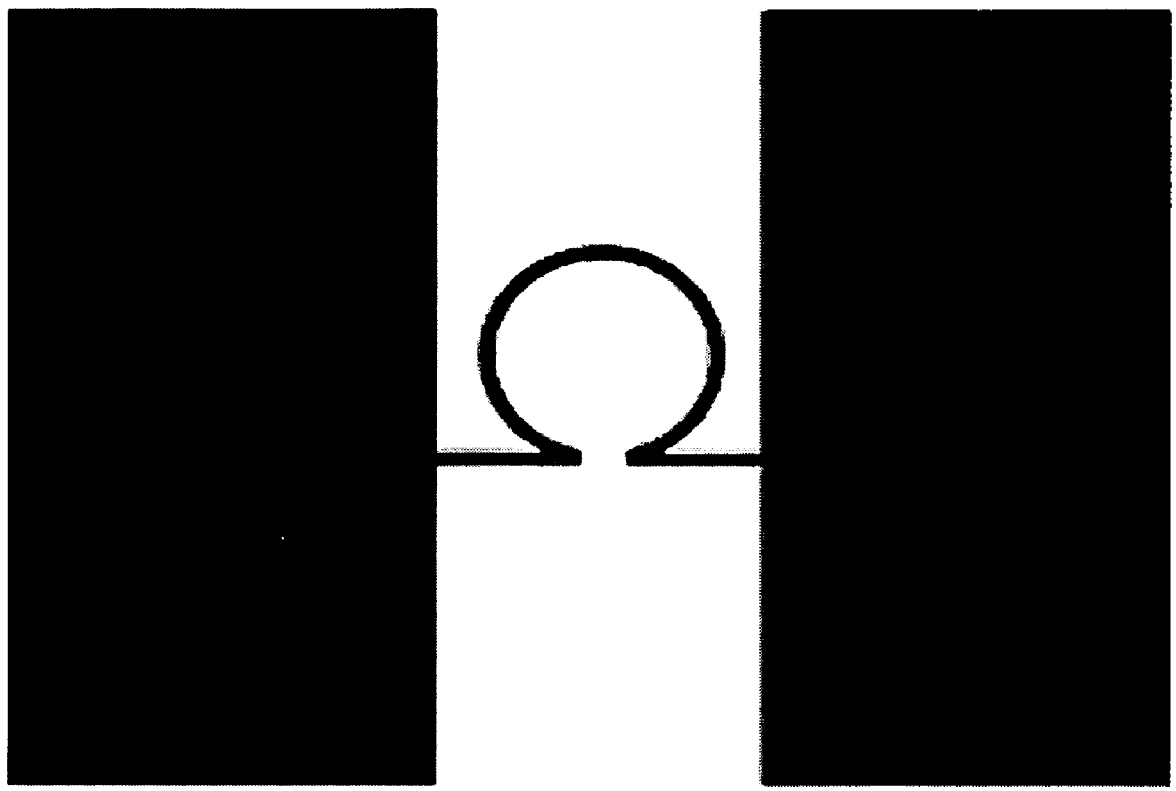

FIG. 12(a) illustrates a computer generated pattern design of an oscillator.

Figure 12B:
Figure 12C:
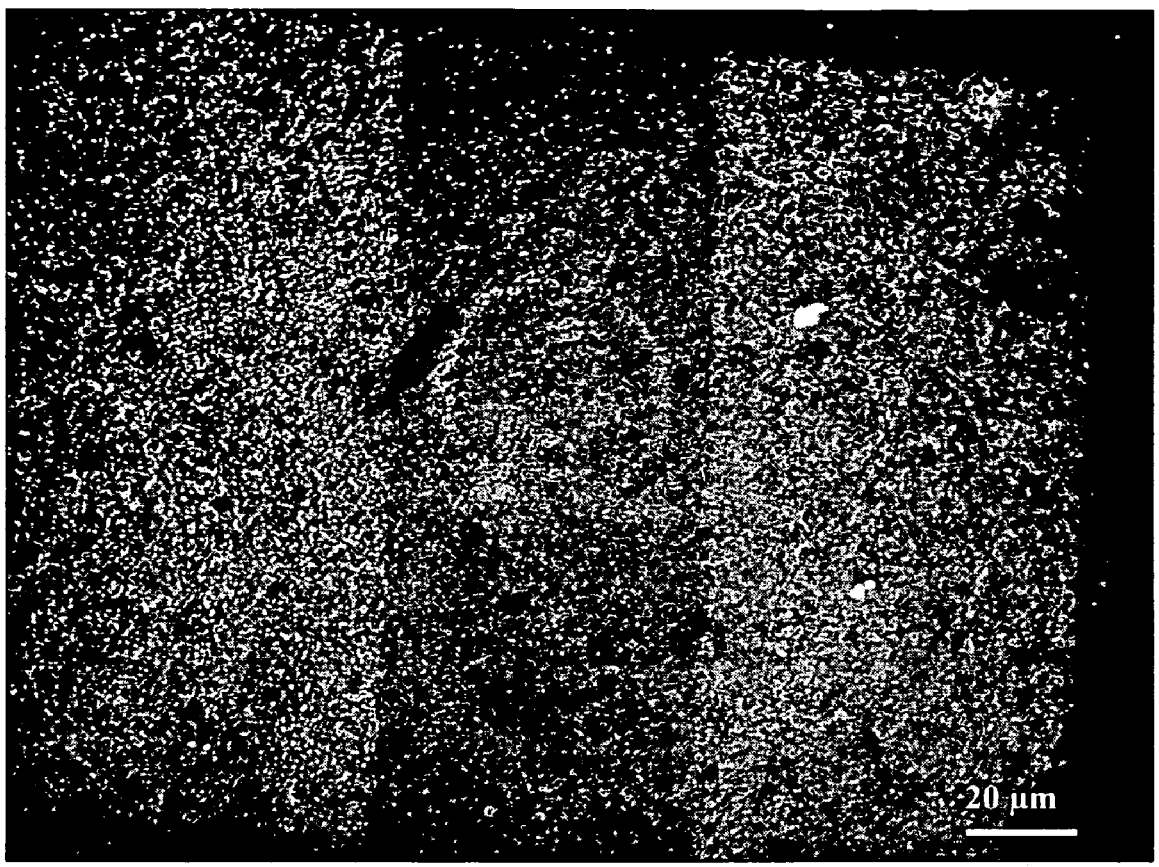

FIGS. 12(b, c) are optical images of oscillator made according to the present invention.

DETAILED DESCRIPTION OF ILLUSTRATIVE EMBODIMENTS

The method of this invention in several embodiments involves a series of steps that allow individual metal electrodes of nanometer size to be selectively patterned on a substrate and subsequent site selective reactions to chemically attach functional molecules to those electrodes.

As used herein the expression "functional molecules" refers to any molecule which is capable of functioning as an electronic, optical, or magnetic component and which, when controllably assembled in accordance with this invention, forms a circuit, optical element, or magnetic device. Representative examples of functional molecules which are suitable for use in the present invention include carbon or oxide nanotubes, nanowires, functionalized, saturated or unsaturated hydrocarbons, including substituted aromatics or conjugated aromatics, natural or synthetic proteins, natural or synthetic polynucleotides, catenanes, rotaxanes, conductive polymers such as polyaniline, semiconductors, nanoparticles of oxides, sulfides, chalcogenides, or the like. As used herein, the term "plurality" means more than one.

The method of the invention in several embodiments exploits ferroelectric properties of substrates. The ferroelectric substrate may be inorganic, e.g. a ferroelectric ceramic material, or organic, e.g. a ferroelectric polymer, and may be grown on a semiconductor substrate, such as silicon. A ferroelectric material is one that contains electrical dipoles having a local surface charge associated therewith. The electric polarization of a ferroelectric material can be oriented by application of an external energy field, such as an electric field. Other processes that could be used to pattern the surface charge include exposure to optical illumination or an electron beam through a mask, exposure to interference patterns of two or more optical or electron beams, and application of electric fields from patterned electrodes (for example those produced from microcontact printing). Representative examples of ferroelectric materials include, without limitation, barium titanate, lead titanate, lead zirconate titanate (PZT), tri-glycine sulfate (TGS), guanidinium aluminum sulfate hexahydrate (GASH), and the like. The ferroelectric material may be in the form of a thin film, a thick polycrystalline film, or a single crystal.

A localized region of positive or negative charge can be established on a ferroelectric substrate, as has been demonstrated using proximity probes, including, for example, commercial Atomic Force Microscopes or Scanning Tunneling Microscopes. For example, a Digital Instruments Dimension 3000 NS-III has been used to make positive and negative domains on PZT. This was achieved by applying a voltage of 10V to the probe tip with the microscope set in contact mode. The size of the switched domain is controlled by the scan size. $W_2C$ coated tips on cantilevers with l=125 μm and resonant frequency .about.350 kHz were used successfully for this purpose. See also, C. Ahn et al. Science, 276: 1100 (1997). The position of the probe tip can be controlled, e.g., by computer, and patterns "written" on the surface of the ferroelectric substrate. Such patterns may include, lines, squares, and other geometrical configurations. Preferably, an array of probe tips will be used to produce the desired pattern, rather than individual tips.

It is now well documented that surface reactions are extremely sensitive to the surface configuration. A difference of a 100 meV of surface potential between positive and negative domains significantly affects surface adsorption. See, for example, V. Henrich and A. Cox, *Surface Science of Oxides*, Cambridge University Press 1994 or D. A. Bonnell, *Progress in Surface Science*, 57: 187-252 (1998). This property is exploited in the practice of the present invention by causing site selective deposition of electrically conductive metal ions to occur at the localized regions of altered polarization, produced as described above.

Photoreduction of the metal ions deposited on the surface of the ferroelectric substrate can be performed according to conventional procedures known in the art. For example, silver may be deposited using a silver nitrate or silver perchlorate solution (typical concentration in the range of from about 0.00001 to about 0.01 $mol/dm^3$), which is exposed to 200-700 nm light. For any given substrate, the deposition rate and metal structure tend to vary with space charge, the presence of electrodes, and surface orientation. Other electrically conductive metals that may be similarly deposited include gold, indium, palladium, platinum, copper or the like. In several embodiments, nanoparticles of the metals are created and photodeposited this way onto ferroelectric substrates. Various inorganic and organic additives may be added to the solution to optimize reaction yields.

The metalized substrate is contacted with a solution of functional molecules having one or more reactive groups that react with the deposited metal and not with the substrate. It is well documented, for example, that a molecule may be derivatized with a thiol group so that it reacts selectively with gold. The most common examples of such molecules are those of the formula $HS(CH_2)_nX$, wherein X may represent —OH, —COOH or —$CH_3$, and n is an integer from 1 to 20, though other molecules may be used including, for example, conjugated molecules and those containing aromatics and/or hetero-atoms. The configuration of the metalization pattern on the substrate and the chemistry for attaching functional molecules to the deposited metal can be adjusted so that the functional molecule links two metal contacts. The end groups of the functional molecules can also be chosen such that one end attaches to the metal contact and the other to an adjacent molecule. Alternatively the end groups of the functional molecules can be designed for molecular recognition, as for chemical or biochemical sensors.

Figure 1:
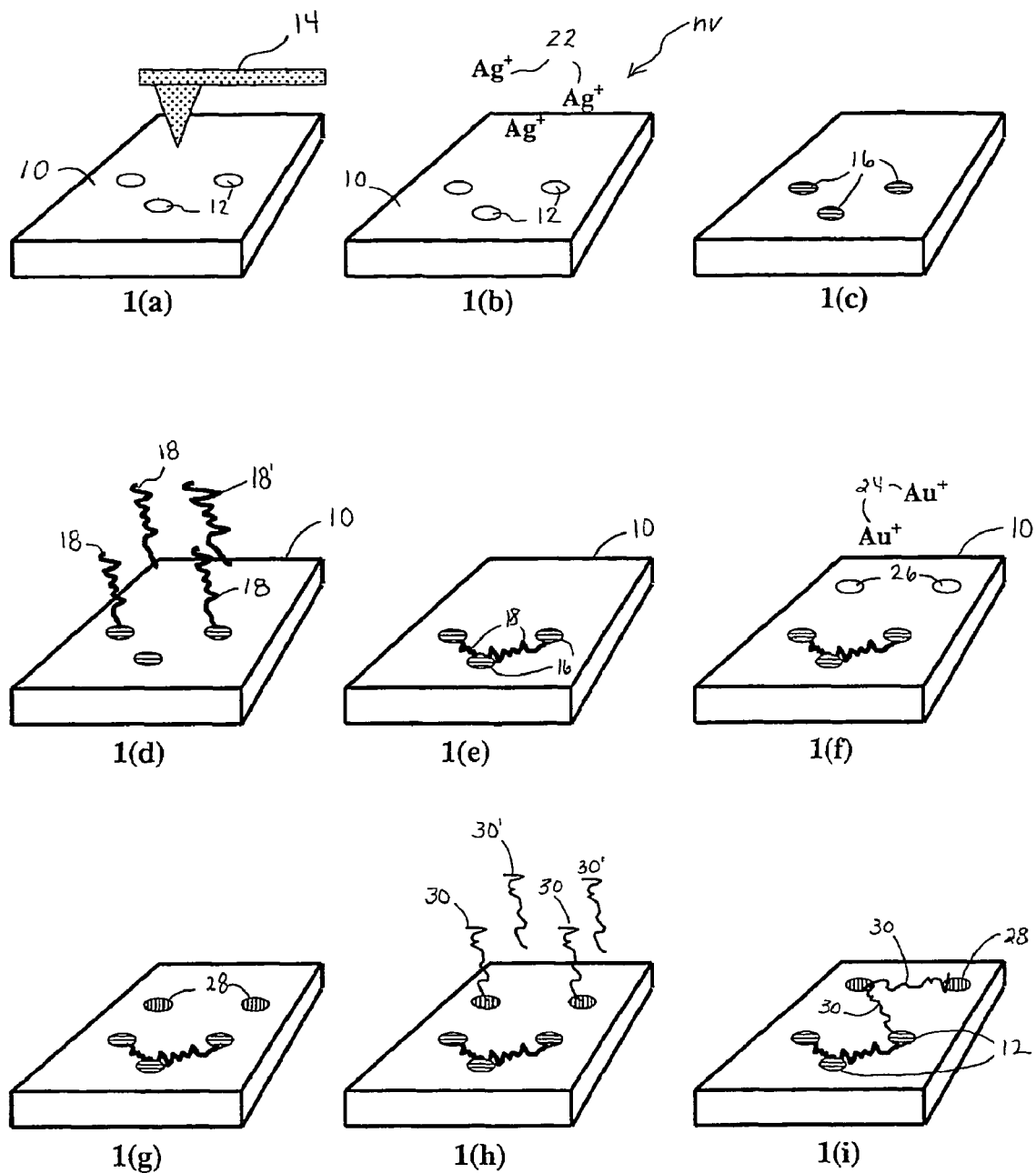
FIG. 1 is a schematic illustration of the method and device of the invention, the details of which are set forth in the description that follows.

In practice, a substrate 10 of ferroelectric material, as shown in FIG. 1, having a first polarization distribution is provided which, as noted above, may be a thin film, a thick polycrystalline film or a single crystal. The orientation of the domains in one or more localized regions 12 of a pre-determined pattern is altered, or "switched," relative to the first polarization distribution in the ferroelectric substrate 10, as shown in stage 1(*a*) of FIG. 1.

As previously noted, this switching of polarization distribution can be accomplished by means of an applied electric field generated, for example, by an Atomic Force Microscope or a Scanning Tunneling Microscope 14. The switched regions may occupy an area as small as 75 square nanometers or smaller. After the domains of the localized regions of the ferroelectric substrate 10 have been altered to have a different orientation from that of the first polarization distribution, as described above, the substrate 10 is exposed, e.g. by dipping, to a solution of electrically conductive metal ions 22, as shown in stage 1(*b*) of FIG. 1. The metal ions 22 are deposited from solution, by adsorption, absorption, chemisorption, and the like, at the switched localized regions 12, due to charge interactions between the metal ions 22 and the switched localized regions 12.

The metal ions 22 from solution are selectively photo-reduced over the oppositely charged region by exposure to light of appropriate wave length, as can be seen in stage 1(*b*). In this way, metal 16 is deposited (i.e., "photodeposited") at the switched localized regions 12, as shown in stage 1(*c*). In addition metal may be deposited at any pre-existing domains having the same polarization orientation as that of the switched localized regions 12, should such domains exist. The metalized substrate 10 is next rinsed leaving a metal film array in the pre-determined pattern. The metalized substrate 10 is thereafter brought into contact, e.g. by dipping, with a solution containing functional molecules 18, 18' as shown in stage 1(*d*). The functional molecules 18, 18' have reactive groups that react with the deposited metal 16 and do not react with the substrate 10. The resulting orientation of the bound functional molecules 18, as illustrated in stage 1(*e*), depends on whether the molecules comprise one or more reactive groups and on the metal pattern selected. For example, the bound functional molecule 18 may comprise a metal-reactive group on each end, such as a thiol, so that the functional molecules 18 bind to two deposited metal regions 16, as shown in step 1(*e*) of FIG. 1. Lastly, the substrate 10 is rinsed to remove any functional molecules 18' not bound during step 1(*d*).

The series of steps comprising the method of the invention may be repeated one or more times, if desired. Subsequent iterations may employ different metals 28, different functional molecules 30, 30', different reactive groups on the functional molecules 30, 30', or a combination of such variations to produce a complex circuit, as can be seen in stages 1(*f*)-1(*i*) of FIG. 1.

In those embodiments in which an organic ferroelectric film is used as the substrate 10, the film can be burned out in the course of performing the method, so that the metal pattern collapses to an underlying surface, e.g. a conventional semiconductor. Ferroelectric nanolithography is a new paradigm for nanostructure assembly that makes use of arrays of atomic polarization in a ferroelectric thin films to direct site-specific adsorption and chemistry. By applying a local field, nanometer-scale domain patterns can be imposed on a surface. Domains can be oriented with SPM, e-beam lithography and electrode stamping, making this a viable practical path to nanofabrication. Polarization charge affects the local electronic structure; specifically, upward and downward band bending results from local charge. Electron transfer reactions are therefore domain specific, as demonstrated both by temperature programmed desorption and photo reduction of metal.

Spatial variations in local electronic structure result from the local electric fields associated with atomic polarization. The interplay of polarization and charge is probed by injecting electrons into the surface, by generating electron/hole pairs by photo excitation, and adsorbing charge species on the surface. In some cases the dynamics of charge compensation can be clearly distinguished. The polarization-charge interactions indicate that chemical reactivity is domain specific. Atomic polarization can be aligned with an electron beam, or micro contact electrodes, as well as with the local field from a probe tip. When combined with the processes associated with chemical self-assembly, these can be used to selectively position complex nanostructures. This approach can be used to co-assemble structures consisting of oxide substrates, metal nanoparticles and organic molecules.

Plasmonics is particularly concerned with how surface plasmons propagate, localize, or interact on metal nano- and microstructures. Exploitation of surface plasmon propagation in these regimes can be used to develop new devices in nano-optics and optical computing, waveguides, biomolecular and chemical sensor arrays, optical filters, and surface enhanced Raman substrates (SERS).

The methods of preparing one or more opto-electronic components by patterning nanoparticles in an arrangement that facilitates responses to optical illumination, typically comprise applying an electric field in a patterned arrangement to at least a portion of a ferroelectric surface to induce a patterned polarization distribution of the portion of the ferroelectric surface; and photodepositing a plurality of nanoparticles on the portion of the ferroelectric surface, at least a portion of the plurality of nanoparticles being positioned adjacent to one or more electrodes. Any type of nanoparticles can be used according to the methods described herein, and typically the plurality of nanoparticles are composed of metal compounds, metal alloy compounds, oxide compounds, semiconductor compounds, organic compounds, or any combination thereof. Among these, the metal compounds typically include Ag, Au, Pd, Pt, Cu or any combination thereof. Nanoparticles typically range in size from about 1 nm to about 30 nm, and more typically from about 2 nm to about 20 nm. The nanoparticles may have any geometric shape, and typically the nanoparticles are spherical. In certain embodiments, the nanoparticles consist essentially of a noble metal, such as gold, which is useful in plasmonics applications wherein the metal nanoparticles form lines that are sufficiently close to each other, for example between about 1 nm and about 10 nm, to permit energy conversion between the lines of nanoparticles.

In other embodiments, the oxide compounds typically include one or more metal oxides, for example, silver oxide, cobalt oxide, nickel oxide, titanium oxide, or any combination thereof.

In certain embodiments of the ferroelectric nanolithography methods described herein, the application of an external electric field typically provides a pattern of nanoparticles that gives rise to an opto-electronic component. Any pattern can be envisioned for patterning useful opto-electronic components. For example, the nanoparticles can be deposited on the ferroelectric surface in the form of an array. Various type of arrays are envisioned, for example one dimensional arrays and two dimensional arrays. The nanoparticles may be patterned in an ordered fashion or a disordered fashion. For example, the nanoparticles may form a disordered arrangement on the portion of the surface of the ferroelectric surface having the changed polarization distribution.

In embodiments wherein the nanoparticles form a linear array, the nanoparticles typically extend from one or more electrodes. Preferably the nanoparticles extend between two electrodes. The electrodes are typically connected to a voltage source and provide a bias between the nanoparticles. The one or more electrodes can be formed using a variety of methods, for example, by photodepositing a plurality of nanoparticles the ferroelectric surface, by photodeposition, thermal deposition, e-beam lithography, optical lithography, nanoimprint lithography, or any combination thereof. The metal electrodes may be deposited in any order relative to the nanoparticles, for example they may be deposited onto the ferroelectric surface prior to, simultaneously, or subsequent to the step of photodepositing the nanoparticles.

The photodeposited nanoparticles typically reside directly adjacent to each in several embodiments of the invention, for example the nanoparticles tend to touch their nearest neighboring nanoparticles after deposition. This is particularly preferred in embodiments in which the nanoparticles are metal oxides. In other embodiments, the nanoparticles are separated by a distance in the range of from about 1 to about 10 nm. Typically, an electric current is capable of flowing through an array of nanoparticles upon application of a voltage bias in the range of from −4 V to +4 V to the array of nanoparticles. The array of nanoparticles can be a one dimensional array or a two dimensional array. In one embodiment a plurality of one dimensional arrays are patterned parallel to each other. The size of the array of nanoparticles can be of any dimension, but typically the array is characterized as having at least one dimension that is less than about 50 microns in length, and typically one dimensional array has a length in the range of from about 10 nm to 50 microns.

The photodeposition techniques described herein can be used to prepare any sized region of deposited nanoparticles, down to about 10 nm in dimension. Additional techniques can also be incorporated as needed for preparing useful devices, for example, nanoimprint lithography (NIL), which is also useful for preparing structures down to about 10 nm in dimension.

The methods described are useful, in certain embodiments, for preparing opto-electronic devices whereupon illumination of the nanoparticles with light increases current flow through the nanoparticles, the nanoparticles being subjected to a voltage bias. White light is typically used. Suitable light typically will include photons having an energy that is higher the band gap of the nanoparticles. The band gap typically depends on composition of the nanoparticles, the geometry of the particles, as well as the size and spacing of the nanoparticles. For example, one typically needs a longer wavelength photon for lower bandgaps. In certain embodiments, the illumination of the nanoparticles with light gives rise to surface enhanced plasmon interactions among the plurality of nanoparticles.

In embodiments of one dimension arrays of nanoparticles, the one dimensional array of nanoparticles are preferably positioned between two electrodes. When the two electrodes are connected to a voltage supply, the absolute value of the electric current through the one dimensional array of nanoparticles in the dark can be in the range of from about zero to about 5 nA. When illuminated, however, the absolute value of the electric current through the one dimensional array of nanoparticles can be substantially increased. For example, when illuminated with light, the electric current can be in the range of from about zero to about 100 nA.

In other embodiments of the claimed invention, the nanoparticles can be bridged by one or more bridging molecules. The bridging molecules typically bridge adjacent nanoparticles, although long bridging molecules, such as polymers can bridge nanoparticles that are not adjacent. Suitable bridging molecules include an organic molecule, a biological molecule, a polymer molecule, or any combination thereof. A suitable organic molecule includes a porphyrin, a dendrimer, a dye, a chromophore, or any combination thereof. A suitable biological molecule includes an amino acid, a nucleic acid, a peptide, a carbohydrate, and any derivatives and combinations thereof. A suitable polymer molecule includes an electrically conductive polymer, examples of which include polyacetylene, polyparaphenylene, polypyrrole, polyparaphenylene sulfide, polythiophene, poly(1,4-phenylenevinylene), poly-3-methyl thiophene, polycarbazole, polyisothianaphene, poly(1,6-heptadiyne), poly(3-alkyl thiophene), where alkyl is $C_nH_{2n+1}$, for n=1 to 10, polyquinoline, poly(3-alkylsulfonate), where alkyl is $CH_2CH_2SO_3Na$ or $(CH_2)_4SO_3Na$, polyaniline, as well as random copolymers, block copolymers, graft copolymers, blends, soluble derivatives, and any combination thereof. Electrically conductive polymers can be used in the opto-electronic methods and devices of the present invention as photon emitters and photon absorbers.

The bridging molecule used in certain embodiments of the present invention can absorb light which increases the electrical conductivity of the bridging molecule. In this regard, the methods described herein may further include the step of illuminating the nanoparticles and bridging molecules with light to increase the electrical conductivity of the component. The increase in conductivity is typically at least 10 percent, more typically at least 50 percent, even more typically at least 100 percent, even further typically at least 200 percent, and still typically at least 400 percent higher compared to the electrical conductivity of the component when dark. For use in opto-electronic circuits, it is desirable that the increase in conductivity may even be 1, or 2, or 3, or 4 or 5, or more orders of magnitude higher compared to the electrical conductivity of the component when dark.

Suitable ferroelectric substrates include barium titanate, lead titanate, lead zirconate titanate, tri-glycine sulfate, guanidinium aluminum sulfate hexahydrate, and any combination thereof. Other ferroelectric substrates known in the art can be suitably used too.

The methods as described herein can be used for preparing various opto-electronic components, for example a switch, an electrical conductor, a resistor, a capacitor, an inductor, an oscillator, a transistor, an electrode, a circuit, an optical waveguide, an optical emitter, an optical detector, or any combination thereof. Combinations of these various components can be used to form useful optoelectronic circuits, the general design of which are readily known to those in the electrical engineering and circuit design arts.

The present invention also provides opto-electronic components that include a substrate; a ferroelectric surface comprising at least one patterned localized region at which the polarization is oriented to a pre-determined orientation; two or more electrodes situated adjacent to the substrate, the ferroelectric surface, or any combination thereof; and a plurality of nanoparticles situated adjacent to the patterned localized region at which the polarization is oriented to a predetermined orientation, and the nanoparticles being situated between at least two of the electrodes. Circuits comprising two or more integrated opto-electronic components are also provided herein.

Any of the substrates and methods of patterning the localized regions can be used in these embodiments. The ferroelectric surface may be applied as a thin film to a non-ferroelectric substrate. In other embodiments, the ferroelectric surface is the surface of a ferroelectric substrate. In certain embodiments, the opto-electronic components of the present invention can also include a voltage supply for applying a voltage across the electrodes. The application of the voltage across the electrodes and illumination of the nanoparticles with light gives rise to an electric current through the opto-electronic component.

Any of the types of nanoparticles and optional bridging molecules described herein may be used for preparing opto-electronic devices of the present invention. For example, the plurality of nanoparticles may be composed of metal compounds, metal alloy compounds, oxide compounds, semiconductor compounds, organic compounds, or any combination thereof. The metal compounds may include, for example, Ag, Au, Pd, Pt, Cu or any combination thereof. The oxide compounds may include one or more metal oxides, for example, silver oxide, cobalt oxide, nickel oxide, titanium oxide, or any combination thereof. And the semiconductor compound includes quantum dots.

Any arrangement of the nanoparticles as described herein can also be adapted from the methods as described herein for providing the opto-electronic components. For example, in several embodiments, the nanoparticles may form of an array on the ferroelectric surface. The array may be a one dimensional array or a two dimensional array. The nanoparticles may form a disordered arrangement on the portion of the surface of the ferroelectric surface. In other embodiments, the nanoparticles may form a linear array extending from the one or more electrodes. In this embodiment, the one or more electrodes can be formed by photodepositing a plurality of nanoparticles the ferroelectric surface. In some preferred embodiments, the nanoparticles form a linear array extending between two electrodes. Here, the metal electrodes can be deposited using photodeposition, thermal deposition, e-beam lithography, optical lithography, nanoimprint lithography, or any combination thereof. Some embodiments the nanoparticles are directly adjacent to one another, for example metal oxides, in other embodiments the nanoparticles may separated by a distance in the range of from about 1 to about 10 nm. Other embodiments, for example in plasmonics applications wherein a plurality of one dimensional arrays are patterned parallel to each other, the nanoparticles consist essentially of gold.

The optoelectronic components of the present invention can be operated wherein an electric current is capable of flowing through an array of nanoparticles upon application of a voltage bias. Typically, the voltage bias applied to the array of nanoparticles is in the range of from −4 V to +4 V. Higher and lower operating voltages are also envisioned. The array may be a one dimensional array or a two dimensional array. Typically, the array is characterized as having at least one dimension that is less than about 50 microns in length. In certain embodiments, the one dimensional array will generally have a length in the range of from about 10 nm to 50 microns. In other embodiments, the array dimension will be at least 20 nm, or at least 40 nm, or at least 80 nm, or at least 150 nm, or at least 300 nm. In some embodiments, the array dimension may be less than about 50 microns, less than about 25 microns, less than about 10 microns, less than about 5 microns less than about 2 microns, less than about 1 micron, or even less than about 750 nm.

The opto-electronic components in some embodiments operate whereupon illumination of the nanoparticles with light increases current flow through the nanoparticles, the nanoparticles being subjected to a voltage bias. In some of these embodiments, the illumination of the nanoparticles with light gives rise to surface enhanced plasmon interactions among the plurality of nanoparticles. This effect is particularly useful in preparing plasmonics devices.

In other embodiments, the one dimensional array of nanoparticles are positioned between two electrodes of the opto-electronic component. In these embodiments, the electrodes may be subjected to a voltage and the absolute value of the electric current through the one dimensional array of nanoparticles in the dark is in the range of from about zero to about 5 nA. When illuminated, the absolute value of the electric current through the one dimensional array of nanoparticles when illuminated with light is in the range of from about zero to about 100 nA.

The opto-electronic components of the present invention may also include nanoparticles that are bridged by one or more bridging molecules. Any of the bridging molecules and methods of attaching the bridging molecules to the nanoparticles as described hereinabove can be used. For example, the bridging molecules bridge adjacent nanoparticles. The bridging molecules may include an organic molecule, a biological molecule, a polymer molecule, or any combination thereof. The organic molecule may include a porphyrin, a dendrimer, a dye, a chromophore, or any combination thereof. The biological molecule may include an amino acid, a nucleic acid, a peptide, a carbohydrate, and any derivatives and combinations thereof. The polymer molecule may include an electrically conductive polymer, for example, polyacetylene, polyparaphenylene, polypyrrole, polyparaphenylene sulfide, polythiophene, poly(1,4-phenylenevinylene), poly-3-methyl thiophene, polycarbazole, polyisothianaphene, poly(1,6-heptadiyne), poly(3-alkyl thiophene), where alkyl is $C_nH_{2n+1}$, for n=1 to 10, polyquinoline, poly(3-alkylsulfonate), where alkyl is $CH_2CH_2SO_3Na$ or $(CH_2)_4SO_3Na$, polyaniline, as well as random copolymers, block copolymers, graft copolymers, blends, soluble derivatives, and any combination thereof.

In embodiments of the opto-electronic components having one or more bridging molecules adjacent to the nanoparticles, the bridging molecules can be selected to absorb light which increases the electrical conductivity of the bridging molecule. Accordingly, illuminating the nanoparticles and bridging molecules with light gives rise to an increase in the electrical conductivity of the component in several embodiments of the invention. The increases in electrical conductivity in these embodiments of the opto-electronic device can be at least 10 percent higher or even five orders of magnitude higher as described hereinabove.

As described herein, the opto-electronic components of the present invention include at least on substrate. Suitable substrates are typically ferroelectric themselves, or ferroelectric thin films may be deposited on other types substrates that may not be ferroelectric (e.g., silicon) or may be ferroelectric. Suitable ferroelectric substrates, surfaces and thin films include barium titanate, lead titanate, lead zirconate titanate, tri-glycine sulfate, guanidinium aluminum sulfate hexahydrate, and any combination thereof. A design of a particular type of optoelectronic devices is patterned on the ferroelectric substrate, surface or thin film. A suitable design includes a switch, an electrical conductor, a resistor, a capacitor, an inductor, an oscillator, a transistor, an electrode, a circuit, an optical waveguide, an optical emitter, an optical detector, or any combination thereof. Opto-electronic circuits comprising two or more opto-electronic components can also be readily prepared.

The present invention also provides methods of preparing components having patterned photodeposited nanoparticles on a substrate surface. These methods include scanning an atomic force microscope tip across a first surface of a ferroelectric substrate to alter atomic polarization of specific domains of the surface; controllably biasing the tip using a computer programmable voltage source to produce a desired pattern for the component; contacting the specific domains of the surface to a photosensitive solution; and exposing the photosensitive solution to light to deposit the nanoparticles in the desired pattern. Conductors, resistors, capacitors, waveguides, inductors, oscillators, transistors, and the like, are provided as set forth herein.

For preparing a resistor, for example, the substrate is an insulator and the pattern includes lines of electrically conductive nanoparticles in which the resistance is controlled by the line dimensions. The resistor is characterized by connecting an ohmmeter to the ends of the deposited line and checking the resistance, which along with the dimensions of the deposited line will give the resistivity.

For preparing a capacitor, for example, the substrate is a dielectric material having a patterned metallic layer situated on a second surface of the ferroelectric substrate, wherein the nanoparticles are deposited on the first surface opposite to the patterned metallic layer situated on the second surface. Another method of preparing a capacitor includes using two or more lines of nanoparticles that are patterned on an insulating substrate, the lines of nanoparticles being separated by a distance in which the capacitance is controlled by the distance between the lines.

For preparing an inductor, for example, one or more lines of nanoparticles are patterned in a spiral fashion comprising a number of turns on an insulating substrate. The inductor is characterized using an ohmmeter to check the resistance of the deposited lines. The impedance is characterized by placing the device in an impedance analyzer that measures parameters such as Q(efficiency), inductance, direct current resistance, and self resonant frequency.

For preparing an oscillator, for example, the lines of nanoparticles form an integrated pattern on an insulating substrate, the integrated pattern comprising a capacitor pattern and an inductor pattern. The oscillator is characterized by placing a frequency dependent source on the device and measuring the characteristics of the frequency response.

For preparing a transistor, for example, the substrate can include a metal gate layer on a second surface opposite to the first surface, the first surface comprising source and drain electrodes on the first surface, and the nanoparticles deposited between the source and drain electrodes. The transistor is characterized by placing probes on the source, drain, and gate electrodes and measuring the transistor characteristics.

EXAMPLES

Figure 2:
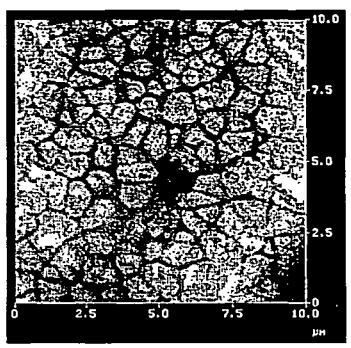
FIGS. 2(a)-2(f) are photomicrographs showing the surface topography and polarization distribution of lead zirconate titanate substrates before and after switching.
Figure 2:
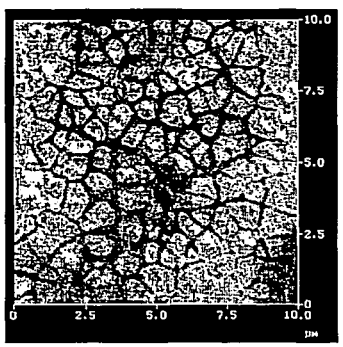
Figure 2:
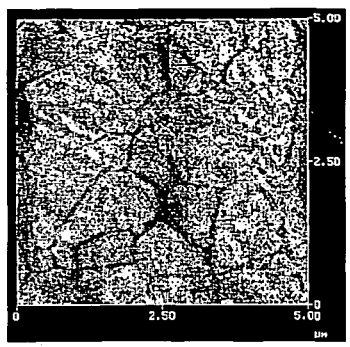
Figure 2:
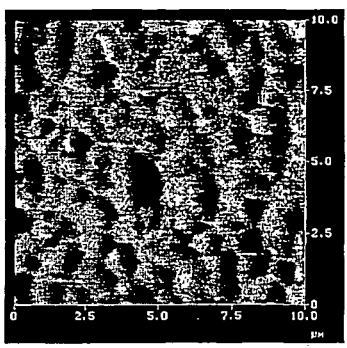
Figure 2:
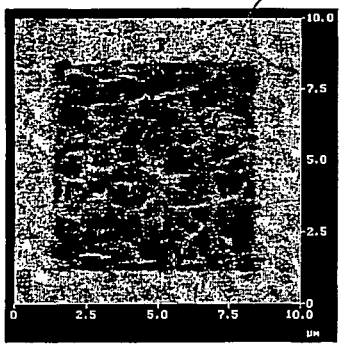
Figure 2:
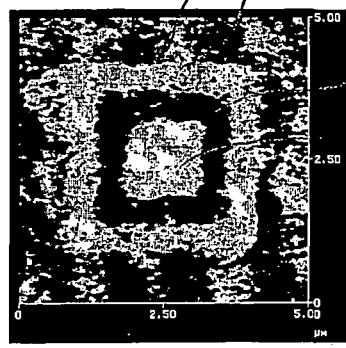

FIG. 2 is an illustrative example of a lead zirconate titanate substrate patterned in accordance with step 1(a) of FIG. 1. Prior to writing the substrate to orient the domains, contact-mode AFM and piezoresponse force microscopy (PFM) measurements were performed using a commercial instrument (Digital Instruments Dimension 3000 NS-III) to characterize the topography, FIG. 2(a), and polarization distribution, FIG. 2(d), of the surface. To perform piezoresponse measurements, the AFM was additionally equipped with a function generator and lock-in amplifier (DS340, SRS 830, Stanford Research Systems). Platinum coated tips (1>>125 μm, resonant frequency .about.350 kHz, SiliconMDT NSCS12 Pt) were used for these measurements. After characterization of the initial state of the substrate surface, selected portions of the surface were addressed to provide regions of switched polarization.

The tip of the AFM was biased −10 Vdc and scanned over a square region of the substrate surface to switch the polarization therein to provide a switched localized region 112, as seen in FIG. 2(e). Comparison of the surface topography before and after switching, FIGS. 2(a) and 2(b), respectively, revealed that the switching did not alter the surface topography. More complicated patterns may also be created by the multiple applications of step 1(a) of FIG. 1, as shown in FIG. 2(f).

The localized region 100 of switched polarization shown in FIG. 2(f) includes three nested squares 102, 104, 106 having sides of differing lengths, each square centered about the same point. The first localized region 100 was formed by switching the polarization of localized region 102 by biasing the tip of the AFM to −10 Vdc and passing it over the area of first localized region 102 to orient the polarization within the outermost square. Subsequently, the tip of the AFM was biased to +10 Vdc and passed over the area of the second localized region 104 to switch the polarization within the second localized region 104. Then, the tip of the AFM was biased to −10 Vdc and passed over the area of the third localized region 106 to switch the polarization within the innermost square. As a result of this processing, a localized region 100 is created having the three nested squares 102, 104, 106 of alternating, switched polarizations.

Figure 3:
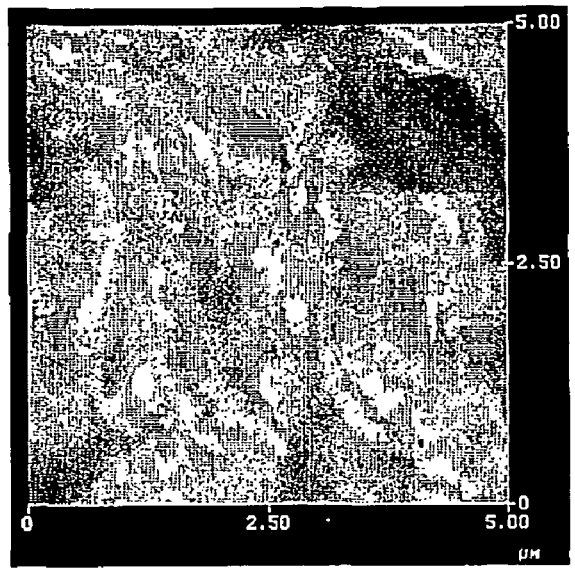
Figure 3:
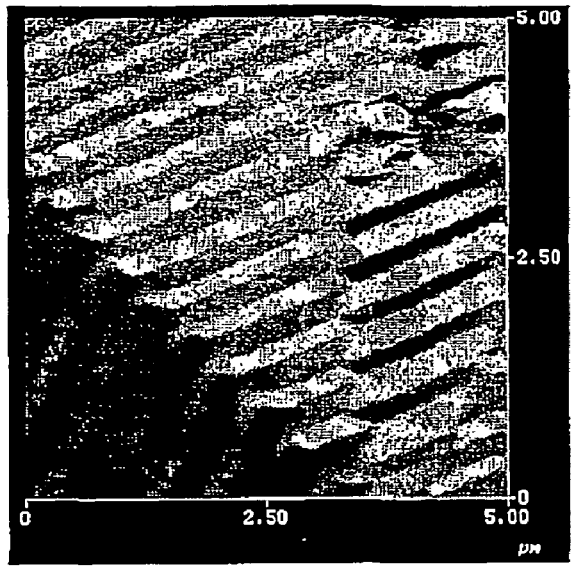
Figure 3:
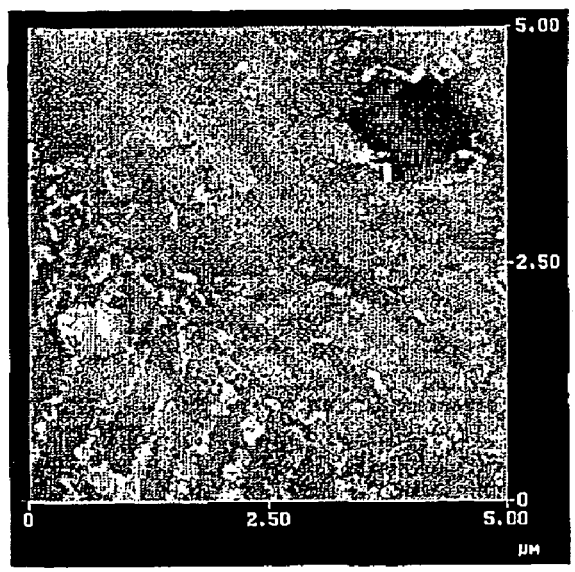
Figure 3:
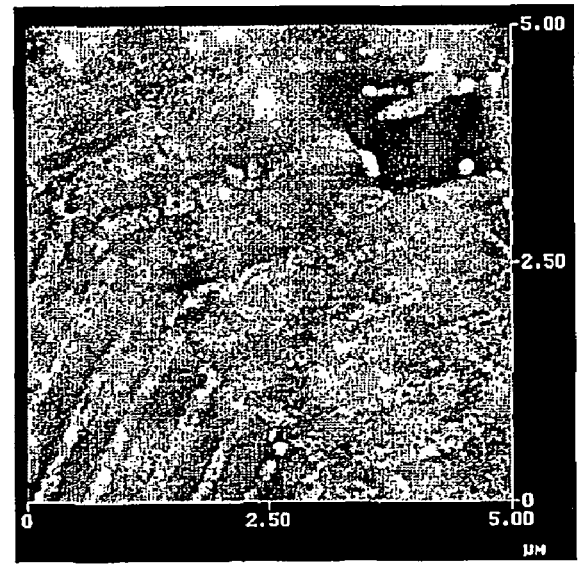
Figure 4:
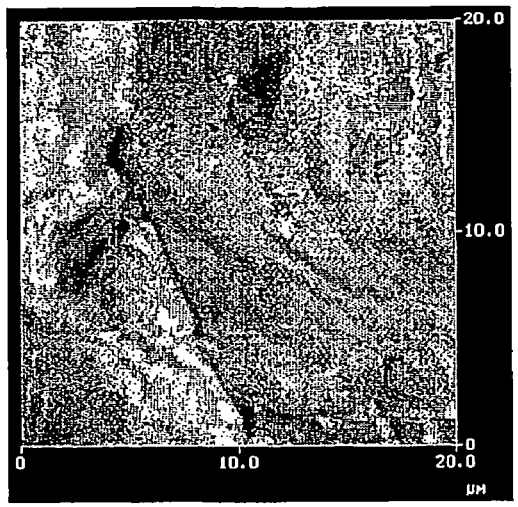
Figure 4:
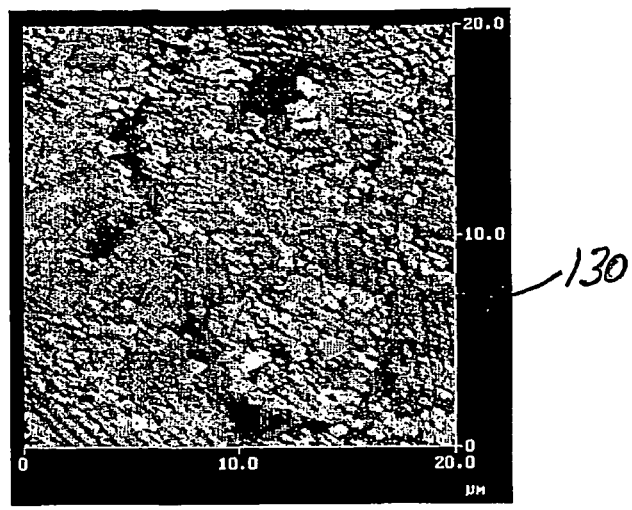
Figure 4:
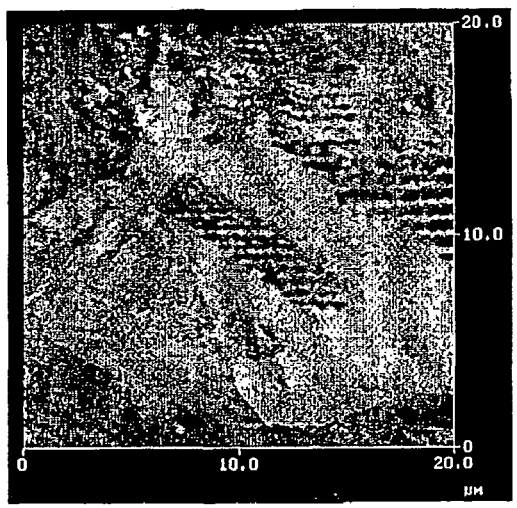
Figure 4:
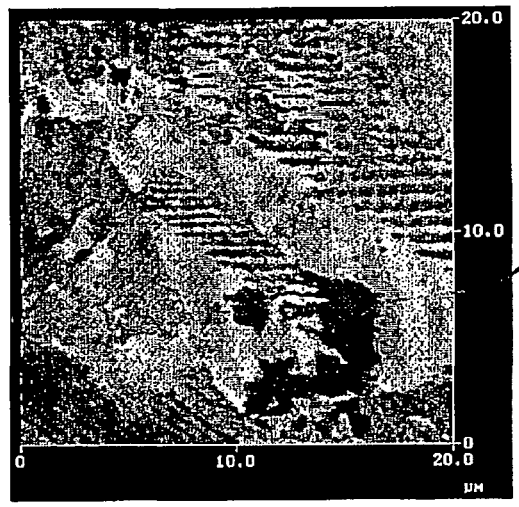

FIG. 4 is an illustrative example of a substrate provided with deposited metal in accordance with steps 1(a) through 1(c) of FIG. 1, whereas FIG. 3 is an illustrative example of a substrate provided with deposited metal in accordance with steps 1(b) and 1(c) of FIG. 1. As shown in FIGS. 3 and 4, polished and annealed BaTiO$_3$ ceramic samples were imaged using PFM. Biasing was used to perform local polarization switching in the selected regions of the sample of FIG. 4, and PFM was used to confirm the modifications in the domain structure. The sample of FIG. 3 was not switched but used in its unaltered polarization state. The switched sample of FIG. 4 and the unaltered sample of FIG. 3 were each placed in a cation solution and irradiated by UV lamp. Finally, tapping mode AFM was used to image the same region and determine the deposition pattern. Throughout the experiment, large scale topographic features (pores, grain boundaries, etc) were used to ensure that the imaging was performed over the same region. The details of the individual experimental steps are given below.

BaTiO$_3$ samples were prepared by sintering commercial BaTiO$_3$ powder (Aldrich), which was thereafter ball-milled and pressed into pellets. The pellets were annealed for 12 hours at 1400° C., and samples were cut by a diamond saw and exposed surfaces were polished with SiC media down to 1 μm grit size. Subsequently, samples were polished by alumina down to 50 nm size. The samples thus obtained were then thermally etched at 1200° C. for 12 hours. The etching resulted in the formation of the grooves at the grain boundaries and faceting of the grain themselves, resulting in the clearly seen topographic contrast of the surface, as seen in FIGS. 3(a) and 4(a). At the same time, the thermal etching relieved surface damage associated with polishing processes. This preparation yielded a substrate material having a distribution of polarization domains.

Contact-mode AFM and PFM measurements were performed using the same equipment described above with respect to the measurement of the samples of FIG. 2. With regard to the sample of FIG. 3, after characterization of the initial state of the substrate surface, the sample was not switched, and metal was deposited onto the substrate in accordance with steps 1(b) and 1(c) of FIG. 1.

To perform the photo-deposition of step 1(b) of FIG. 1, the BaTiO$_3$ sample shown in FIG. 3(b) was placed in a 0.01 M AgNO$_3$ solution and irradiated by a Xe—UV lamp for 10 s at 100 W. Afterwards, the sample was washed with deionized water and dried by air flow, to yield a surface having elemental silver deposited thereon in locations corresponding to the polarization pattern of FIG. 3(b), as shown by the bright lines in FIG. 3(c). The ability to deposit palladium on the sample was demonstrated by removing the deposited silver from the sample of FIG. 3(c) and subsequently processing the sample in a 0.01 M PdCl$_2$ solution. Deposition conditions were specific for the individual cations, e.g. Pd required a longer exposure time (.about.30 min from 0.01 M PdCl$_2$ solution) than Ag. After exposing the sample with a Xe—UV lamp for 30 minutes at 100 W and washing, elemental palladium was deposited at localized regions corresponding to the polarization pattern of FIG. 3(b), as shown by the bright lines in FIG. 3(d).

Regarding the sample of FIG. 4, after characterization of the initial state of the substrate surface, selected portions of the surface were addressed to provide regions of switched polarization, as shown in FIGS. 4(c). For the step of polarization switching in the BaTiO$_3$ ceramic samples, step 1(a) of FIG. 1, the atomic force microscope was equipped with a PS310 high voltage power supply (Stanford Research Systems), because polarization switching in BaTiO$_3$ ceramics requires relatively high voltages (100 Vdc) and the internal microscope channels limit the writing voltage to 12 Vdc. To avoid capacitive cross-talk in the scanning probe microscope (SPM) head, the electrical connections between the microscope and the tip were severed; instead a wire was connected from the function generator to the tip using a custom-built sample holder. This set-up also allowed application of the high voltages (up to 100 Vdc) necessary to perform polarization switching in the BaTiO$_3$ ceramic substrate.

To perform local polarization switching, the ac biasing of the tip was discontinued, and dc voltage was applied to the tip. After scanning a selected region, the tip was ac biased and scanned over a larger region, thus allowing the switched domain to be read. The modulation amplitude in the PFM imaging was 6 Vpp. The use of larger modulation amplitudes resulted in polarization reversal in the switched regions. The sample of FIGS. 4(b) and 4(d) was written with a square pattern 130.

The photo-deposition of step 1(b) of FIG. 1, the BaTiO$_3$ was performed by placing the sample in a 0.01 M AgNO$_3$ solution and irradiating the sample with a Xe—UV lamp for 10 s at 100 W. Afterwards, the deposition samples were washed with deionized water and dried by air flow. FIG. 4(b) shows elemental silver (the bright regions) deposited on the surface of the substrate in the regions corresponding to the polarization-switched regions, such as switched region 130 for FIG. 4(b). In addition, as seen in FIG. 4(b), silver is deposited outside the switched region 130, since the substrate contained a random distribution of polarization domains outside of the switched region 130. However, the highest density of silver is contained with in the switched region 130, as shown in FIG. 4(b).

To create a nanoscale molecular device from the metallized substrates of the types depicted in FIG. 4, a functional molecule tailored to the functionality required in the final device may be attached to one or more of the deposited metal regions of the substrate. For example, a device having diode electrical properties may be created by attaching a monolayer of 2'-amino-4-ethynylphenyl-4-ethynylphenyl-5'-nitro-1-benzenethiol between two deposited metal regions of the substrate. Such a molecule is demonstrated to have diode electrical properties, as disclosed in J. Chen, et al., *Science*, 286: 1550-51 (1999).

As will be appreciated by those experienced in the field of this invention, the method described and exemplified above exploits the advantages of chemical self-organization, while overcoming its primary disadvantage, namely, the inability to selectively position individual functional molecules. Moreover, the materials employed have been accepted in commercial, semi-conductor fabrication processes for other applications. Thus, material compatibility should not pose an impediment to implementation of this nano technology.

Nanoscale devices fabricated as described herein may be used in computers and all electronic systems that utilize computer processors, including consumer electronics, wireless systems and medical diagnostics, to name a few. They may also be used as active components of optical devices, chemical and biochemical sensors. In these cases the functional molecule would be chosen to be optically active for the former and have chemical specificity or molecular recognition properties for the latter. In all cases the devices might be stand alone or integrated into larger systems, such 'system on a chip' designs.

Several opto-electronic devices were prepared using by photodepositing various nanoparticles, as described in Table I. The devices were patterned on PZT surfaces. Each surface included two gold electrodes separated by a 20 micron gap. Electronic and optical switches were made by patterning metal nanoparticles in arrangements that facilitate responses to optical illumination. The patterning was accomplished using the ferroelectric nanolithography techniques as described herein. An external electrical field was applied to the surface to induce a change in local electronic structure. Based on this change, nanoparticles were photo deposited selectively on the patterns. A number of metal and oxide compounds were deposited in this manner. A line of particles were deposited between two electrodes. Without being bound by any particular theory of operation, when illuminated with light, surface enhanced plasmon interactions apparently allowed substantially more current to flow. This apparently produced an optically enable electrical current or switch. Preliminary data are shown in Table I below. The results indicate that the absolute value of the current increases with illumination.

TABLE I

Electron transport in devices.

| Sample | Resistance at dark | Current baseline at dark[0] | Current with illumination[0] |
|---|---|---|---|
| Ag-PP[1] | 1.3 mega ohm | 5 nA | 6.6 nA |
| Ag-16cSH[2] | 2.5 Giga ohm | −20 pA | −150 pA |
| Ag-Oxide[3] | 20 Giga ohm | 2 pA | 1 nA |
| Gap[4] | 1.5 Giga ohm | 33 pA | 180 pA |

[0]Bias on devices is 0.05 V except the Ag-16cSH sample on which the bias is −0.05 V.
[1]Ag-PP: sample with silver nanoparticles and porphyrin on PZT surface.
[2]Ag-16cSH: sample with silver nanoparticles and hexadecyl mercaptan on PZT surface. The current with this sample was obtained with a negative bias and floating substrate.
[3]Ag-Oxide: sample with silver nanoparticles exposed to air to form oxide layer.
[4]Gap: sample with two gold electrodes, in between which there is nothing except PZT surface. This gap width is about 20 Micrometer.

The opto-electronic device made using the Ag—PP nanoparticles was subjected to a temporally varying illumination (light off/light on). Results of current versus time are provided in FIG. 5, which shows the operability of the opto-electronic device as a light-activated switch.

FIG. 6(a-d) provides XPS data results of the surface of an embodiment of an opto-electronic device of the present invention made using the Ag-16cSH nanoparticles described in Table I. The XPS results confirm that organic molecules attach preferentially to the metal particles.

FIG. 7 illustrates an embodiment of an opto-electronic circuit of the present invention having a linear array of a plurality nanoparticles situated in a linear array between two electrodes. The optical switch is based on a linear array of nanoparticles photoconductance. The opto-electronic component serves as an optical switch. Under a bias, the current going through the device increases to a higher level with a light beam illuminating the nanoparticles, and returns to a low level with the illumination off.

FIG. 8 illustrates an embodiment of an opto-electronic circuit of the present invention having a linear array of a plurality nanoparticles bridged between bridging molecules situated in a linear array between two electrodes. The opto-electronic component serves as an optical switch. Under a bias, the current going through the device increases to a higher level with a light beam illuminating the nanoparticles, and returns to a low level with the illumination off.

Passive and active device components are made by ferroelectric nanolithography. Patterns of metal are photo deposited onto patterned domains of a ferroelectric substrate. Various metals can be patterned with this process including Ag, Au, Pt, and Pd. The ferroelectric substrates have intrinsically high dielectric constants and can be part of the device. Patterns were designed into device configurations in the following examples.

In ferroelectric films, the atomic polarization may be directed perpendicular to the surface in the positive or negative direction or in the plane of the surface. On a randomly oriented surface the polarization vector may have intermediate orientation. In order to exploit atomic polarization assemble complex structures, the local orientation of the domains must be controlled. The schematic in FIG. 9 illustrate a specific example of how atomic polarization can be oriented with a conductive SPM tip and applied voltages in the range of 5 to 10V. Other SPM methods can also be used to orient the domains (not shown).

In this example, an atomic force microscope (AFM) tip is scanned across the surface of a ferroelectric substrate. The tip is biased by the computer programmable voltage source. This allows the user to control the atomic polarization in specific domains to produce the desired pattern. After the ferroelectric substrate has been poled by the applied voltage, it is submerged into a photosensitive solution, which when exposed to ultra-violet light will deposit various particles depending on the solution. The particles could be engineered with different molecules, including organic molecules, to change the desired electrical behavior of the deposited film.

The following examples of electrical devices are or were developed according to the methods of the present invention. Although these are some specific examples, there are many device designs that could be used to achieve the desired electrical performance.

Resistor. Simple lines on the insulating substrate in which the resistance is controlled by the line dimensions.

Capacitor. The substrate is grown on a metallic layer that is patterned with standard processes. The metal pattern deposited on the substrate is coordinated with the pattern below the substrate to make local capacitors.

Capacitor. Simple lines on the insulating substrate are separated by a distance in which the capacitance is controlled by the gap between the lines.

Inductor. Simple lines on the insulating substrate in which the inductance is controlled by the number of turns in the inductor pattern.

Oscillator. Simple lines on the insulating substrate in which both the capacitor and inductor designs are integrated and the pattern behaves as an oscillator.

Transistor. The substrate is grown on a metallic layer that is patterned with standard processes. The metal pattern deposited on the substrate is coordinated with the pattern below the substrate to make interconnected transistors.

Applications. RFID tags, passive circuit boards, wireless communication devices, display panel back plane electronics, molecular electronic integration.

Advantages over other technology. This process can produce smaller feature sizes than screen printing. The process offers a cost advantage in manufacturing compared to semi conductor processing. This will be a factor in applications where active devices are necessary but the performance of Si processors is not required. The process produces features from 10 nm to hundreds of microns so the same manufacturing process will make small devices and integrate to system circuitry. The process can produce circuitry that can integrate hybrid electronics and molecular electronics to macroscopic systems.

Several examples of devices have been fabricated:

Inductors. Two different inductor patterns are presented in FIGS. 10(a) and 11(a). The inductors were fabricated according to the methods of the present invention. Both of the inductor designs were photo-deposited with silver particles. They were also both back-poled before the device pattern was poled so that greater selectivity in deposition rates was achieved. The initial computer generated pattern along with the optical image of the actual device is shown in FIGS. 10(b) and 11(b, c, d). In both designs, electrical contact is made through the contact pads located in the center and just outside the device. The light area in FIG. 10(a) is the outline of the inductor, while the back-poled area can be seen as a darker area surrounding the device. Dark and light are reversed in the image of the device shown in FIG. 10(b). In the inductors of FIGS. 11(b, c, d), the large contact pads are outlined along with the first loop around the center contact pad. The back-poled area can be seen surrounding the device and is outlined.

Oscillators. An oscillator pattern, FIG. 12(a), was applied to a ferroelectric surface according to the methods of the present invention. FIGS. 12(b, c) show an oscillator that is fabricated with silver particles. Electrical contact is made through the large contact pads on either side of the device. The capacitance is controlled by the gap size and the inductance is controlled by the diameter of the loop. The two large contact pads are outlined, along with the outline of the inductor itself and the back-poled area.

While certain embodiments of the present invention have been described and/or exemplified above, various other embodiments will be apparent to those skilled in the art from the foregoing disclosure. For example, functional molecules may be reacted directly onto the ferroelectric substrate, in the event the metal contact is not required for a particular nanoscale device. The present invention is, therefore, not limited to the particular embodiments described and/or exemplified above but is capable of considerable variation and modification without departure from the scope of the appended claims.

What is claimed:

1. An opto-electronic component made according to the process of preparing one or more opto-electronic components by patterning nanoparticles in an arrangement that facilitates a response to optical illumination, comprising:
   a) applying an electric field in a patterned arrangement to at least a portion of a ferroelectric surface to induce a patterned polarization distribution of the portion of the ferroelectric surface; and
   b) photodepositing a plurality of nanoparticles on the portion of the ferroelectric surface having the patterned polarization distribution, at least a portion of the plurality of nanoparticles being positioned adjacent to one or more electrodes.

2. A plasmonic component made according to the process of preparing one or more opto-electronic components by patterning nanoparticles in an arrangement that facilitates a response to optical illumination, comprising:
   a) applying an electric field in a patterned arrangement to at least a portion of a ferroelectric surface to induce a patterned polarization distribution of the portion of the ferroelectric surface; and
   b) photodepositing a plurality of nanoparticles on the portion of the ferroelectric surface having the patterned polarization distribution, at least a portion of the plurality of nanoparticles being positioned adjacent to one or more electrodes.

3. An opto-electronic component, comprising:
   a) a substrate;
   b) a ferroelectric surface comprising at least one patterned localized region at which the polarization is oriented to a pre-determined orientation;
   c) one or more electrodes situated adjacent to the substrate, the ferroelectric surface, or any combination thereof; and
   d) a plurality of nanoparticles situated adjacent to the patterned localized region at which the polarization is oriented to a pre-determined orientation, the nanoparticles being situated adjacent to at least one of the electrodes.

4. The opto-electronic component of claim 3, further comprising a voltage supply for applying a voltage across the electrodes.

5. The opto-electronic component of claim 3, wherein application of the voltage across the electrodes and illumination of the nanoparticles with light gives rise to an electric current through the opto-electronic component.

6. The opto-electronic component of claim 3, wherein the plurality of nanoparticles are composed of metal compounds, metal alloy compounds, oxide compounds, semiconductor compounds, organic compounds, or any combination thereof.

7. The opto-electronic component of claim 6, wherein the nanoparticles are composed of metal compounds that include Ag, Au, Pd, Pt, Cu or any combination thereof.

8. The opto-electronic component of claim 6, wherein the oxide compounds include one or more metal oxides.

9. The opto-electronic component of claim 8, wherein the metal oxides include silver oxide, cobalt oxide, nickel oxide, titanium oxide, or any combination thereof.

10. The opto-electronic component of claim 6, wherein the semiconductor compound includes quantum dots.

11. The opto-electronic component of claim 3, wherein the nanoparticles form an array on the ferroelectric surface.

12. The opto-electronic component of claim 11, wherein the array is a one dimensional array or a two dimensional array.

13. The opto-electronic component of claim 3, wherein the nanoparticles form a disordered arrangement on the portion of the surface of the ferroelectric surface.

14. The opto-electronic component of claim 3, wherein the nanoparticles form a linear array extending from the one or more electrodes.

15. The opto-electronic component of claim 14, wherein the nanoparticles form a linear array extending between two electrodes.

16. The opto-electronic component of claim 15, wherein the electrodes are deposited using photodeposition, thermal deposition, e-beam lithography, optical lithography, nanoimprint lithography, or any combination thereof.

17. The opto-electronic component of claim 3, wherein the one or more electrodes are formed by photodepositing a plurality of nanoparticles onto the ferroelectric surface.

18. The opto-electronic component of claim 3, wherein the nanoparticles are separated by a distance in the range of from about 1 nm to about 10 nm.

19. The opto-electronic component of claim 18, wherein an electric current is capable of flowing through an array of the nanoparticles upon application of a voltage bias in the range of from −4 V to +4 V to the array of nanoparticles.

20. The opto-electronic component of claim 19, wherein the array is a one dimensional array or a two dimensional array.

21. The opto-electronic component of claim 20, wherein a plurality of one dimensional arrays are patterned parallel to each other.

22. The opto-electronic component of claim 20, wherein the one dimensional array has a length in the range of from about 10 nm to 50 microns.

23. The opto-electronic component of claim 22, wherein the one dimensional array of nanoparticles are positioned between two electrodes.

24. The opto-electronic component of claim 23, wherein the absolute value of the electric current through the one dimensional array of nanoparticles in the dark is in the range of from zero to about 5 nA.

25. The opto-electronic component of claim 23, wherein the absolute value of the electric current through the one dimensional array of nanoparticles when illuminated with light is in the range of from zero to about 100 nA.

26. The opto-electronic component of claim 19, wherein the array is characterized as having at least one dimension that is less than about 50 microns in length.

27. The opto-electronic component of claim 3, wherein the nanoparticles are metal oxides that are directly adjacent to each other.

28. The opto-electronic component of claim 3, wherein the nanoparticles consist essentially of gold.

29. The opto-electronic component of claim 3, whereupon illumination of the nanoparticles with light increases current flow through the nanoparticles, the nanoparticles being subjected to a voltage bias.

30. The opto-electronic component of claim 29, wherein the illumination of the nanoparticles with light gives rise to surface enhanced plasmon interactions among the plurality of nanoparticles.

31. The opto-electronic component of claim 3, wherein the nanoparticles are bridged by one or more bridging molecules.

32. The opto-electronic component of claim 31, wherein the bridging molecules bridge adjacent nanoparticles.

33. The opto-electronic component of claim 31, wherein the bridging molecules include an organic molecule, a biological molecule, a polymer molecule, or any combination thereof.

34. The opto-electronic component of claim 33, wherein the organic molecule includes a porphyrin, a dendrimer, a dye, a chromophore, or any combination thereof.

35. The opto-electronic component of claim 33, wherein the biological molecule includes an amino acid, a nucleic acid, a peptide, a carbohydrate, or any derivative or combination thereof.

36. The opto-electronic component of claim 33, wherein the polymer molecule includes an electrically conductive polymer.

37. The opto-electronic component of claim 36, wherein the electrically conductive polymer includes polyacetylene, polyparaphenylene, polypyrrole, polyparaphenylene sulfide, polythiophene, poly(1,4-phenylenevinylene), poly-3-methyl thiophene, polycarbazole, polyisothianaphene, poly(1,6-heptadiyne), poly(3-alkyl thiophene), where alkyl is $C_nH_{2n+1}$, for n=1 to 10, polyquinoline, poly(3-allcylsulfonate), where alkyl is $CH_2CH_2SO_3Na$ or $(CH_2)_4SO_3Na$, polyaniline, or a random copolymer, a block copolymer, a graft copolymer, a blend, a soluble derivative, or any combination thereof.

38. The opto-electronic component of claim 31, wherein the bridging molecule absorbs light that increases the electrical conductivity of the bridging molecule.

39. The opto-electronic component of claim 31, wherein illuminating the nanoparticles and bridging molecules with light gives rise to an increase in the electrical conductivity of the component.

40. The opto-electronic component of claim 39, wherein electrical conductivity of the component when illuminated with light is at least 10 percent higher compared to the electrical conductivity of the component when dark.

41. The opto-electronic component of claim 39, wherein electrical conductivity of the component when illuminated with light is at least 50 percent higher compared to the electrical conductivity of the component when dark.

42. The opto-electronic component of claim 39, wherein electrical conductivity of the component when illuminated with light is at least 100 percent higher compared to the electrical conductivity of the component when dark.

43. The opto-electronic component of claim 39, wherein electrical conductivity of the component when illuminated with light is at least 200 percent higher compared to the electrical conductivity of the component when dark.

44. The opto-electronic component of claim 39, wherein electrical conductivity of the component when illuminated with light is at least 400 percent higher compared to the electrical conductivity of the component when dark.

45. The opto-electronic component of claim 39, wherein electrical conductivity of the component when illuminated with light is in the range of from about 1 to 5 orders of magnitude higher compared to the electrical conductivity of the component when dark.

46. The opto-electronic component of claim 3, wherein the ferroelectric substrate includes barium titanate, lead titanate, lead zirconate titanate, tri-glycine sulfate, guanidinium aluminum sulfate hexahydrate, or any combination thereof.

47. The opto-electronic component of claim 3, wherein the opto-electronic component includes a switch, an electrical conductor, a resistor, a capacitor, an inductor, an oscillator, a transistor, an electrode, a circuit, an optical waveguide, an optical emitter, an optical detector, or any combination thereof.

48. An opto-electronic circuit comprising two or more opto-electronic components of claim 3.

49. A component made according to the method of preparing a component comprising patterned photodeposited nanoparticles on a substrate surface, the method comprising:
 a) scanning an atomic force microscope tip across a first surface of a ferroelectric substrate to alter atomic polarization of specific domains of the surface;
 b) controllably biasing the tip using a computer programmable voltage source to produce a desired pattern for the component:
 c) contacting the specific domains of the surface with a photosensitive solution; and
 d) exposing the photosensitive solution to light to deposit nanoparticles in the desired pattern.

* * * * *

UNITED STATES PATENT AND TRADEMARK OFFICE
CERTIFICATE OF CORRECTION

| | |
|---|---|
| PATENT NO. | : 7,586,166 B2 |
| APPLICATION NO. | : 11/407008 |
| DATED | : September 8, 2009 |
| INVENTOR(S) | : Dawn A. Bonnell et al. |

It is certified that error appears in the above-identified patent and that said Letters Patent is hereby corrected as shown below:

Title Page,
Item (56) References Cited:
OTHER PUBLICATIONS
Page 2, column 2, "Tybell T., et al." reference, delete "$Pb(Zr_{0.2}Ti_{0.8})$O,Thin films," and insert -- $Pb(Zr_{0.2}Ti_{0.8})O_3$ thin films, --.

Column 4,
Line 11, after "described" and insert -- in --.

Column 9,
Line 3, after "higher" and insert -- than --.

Column 10,
Line 50, delete "of an array" and insert -- an array --.
Lines 65-66, delete "may separated" and insert -- may be separated --.

Column 12,
Line 9, delete "types substrates" and insert -- types of substrates --.

Column 20,
Line 38, delete "poly(3-allcylsulfonate)," and insert -- poly(3-alkylsulfonate), --.

Signed and Sealed this

Fourth Day of May, 2010

David J. Kappos
*Director of the United States Patent and Trademark Office*